(12) United States Patent
Kim et al.

(10) Patent No.: US 6,184,720 B1
(45) Date of Patent: Feb. 6, 2001

(54) INTERNAL VOLTAGE GENERATING CIRCUIT OF A SEMICONDUCTOR DEVICE USING TEST PAD AND A METHOD THEREOF

(75) Inventors: Young Hee Kim; Jin Keun Oh, both of Ichon-shi (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/334,920

(22) Filed: Jun. 17, 1999

(30) Foreign Application Priority Data

Jun. 27, 1998 (KR) .................................. 98-24585

(51) Int. Cl.[7] .................................................. H03K 9/08
(52) U.S. Cl. .......................................... 327/37; 365/225.7
(58) Field of Search ................. 365/226, 225.7; 327/37

(56) References Cited

U.S. PATENT DOCUMENTS 5,426,616 * 6/1995 Kajigaya et al. .................... 365/226

* cited by examiner

Primary Examiner—David Nelms
Assistant Examiner—M. Tran
(74) Attorney, Agent, or Firm—Jacobson, Price, Holman & Stern, PLLC

(57) ABSTRACT

An internal voltage generating circuit and method for generating thereof in semiconductor device capable of performing test without any needless transfer between a test equipment and a repair equipment are disclosed. The circuit includes a plurality of test power voltage pads, each of which can be selectively applied with the external power voltage and a ground voltage during test; a fuse programmable control signal generator coupled to the plurality of test power voltage pads for generating a control signal according to the signals applied to the plurality of the test power voltage pads during test, and for generating the control signal according to fuse-programmed state after at least one fuse included therein is programmed; a reference voltage generator for receiving the external power voltage so as to produce a reference voltage having a predetermined level; and a voltage trimming unit for trimming the reference voltage in accordance with the output of the fuse programmable control signal generator.

16 Claims, 20 Drawing Sheets

INTERNAL VOLTAGE GENERATING CIRCUIT OF A SEMICONDUCTOR DEVICE USING TEST PAD AND A METHOD THEREOF

BACKGROUND OF THE INVENTION

The present invention relates to a semiconductor device and, more particularly, to an internal voltage generating circuit of semiconductor device.

Currently, the semiconductor device generally includes an internal voltage generating circuit for generating an internal voltage, the level of which is typically lower than an external power voltage. For example, the internal voltage generating circuit in a semiconductor memory device such as EDO DRAM reduces 3.3 V external power voltage to 2.8 V internal power voltage.

However, due to deviation in the fabrication process, the voltage level of the internal voltage generating circuit of semiconductor device may not be the desired voltage level. For repairing these defects in a test stage of such a semiconductor device, there has been proposed a fuse programmable internal voltage generating circuit.

FIG. 1 is a block diagram for illustrating a general internal voltage generating circuit of semiconductor device, which is programmable.

Referring to FIG. 1, the internal voltage generating circuit 100 comprises a reference voltage generator 200, a fuse programmable control signal generator 300, a voltage level trimming unit 400 and an internal voltage driver 500 and the generated internal power voltage Vint is applied to an internal circuit 600.

The reference voltage generator 200 generates a predetermined level of reference voltage Vr1 irrespective of the change of temperature and/or the change of external power voltage, so as to apply the Vr1 to the voltage level trimming unit 400.

The fuse programmable control signal generator 300 includes a plurality of fuses, which are programmed (this means that the fuses are selectively cut) at test stage. Thus, according to the programmed fuse state, one of the multiple control signals S is active. The voltage level trimming unit 400 trims the level of the reference voltage Vr1 so as to apply its output Vr2 to the internal voltage driver 500. At this time, the degree of trimming depends on the multiple control signal S. The internal voltage driver 500 generates the internal power voltage Vint for driving the internal circuit 600, based on the voltage Vr2. That is, the output voltage Vr2 of the voltage level trimming unit 400 can be controlled by suitably programming(e.g. selectively cutting) the fuses included in the fuse programmable control signal generator 300 and the level of the internal power voltage Vint can be controlled in turn.

The test for the semiconductor device having such a fuse programmable internal voltage generating circuit as this must be performed as follows. First, the level of the internal power voltage Vint is measured in a test equipment. Then, the semiconductor device must be carried to a repair equipment and then the fuses included in the internal voltage generating circuit are selectively cut in the repair equipment so as to trim the internal power voltage Vint. After the internal power voltage Vint is trimmed, the semiconductor device must be carried back to the test equipment, so as to pre-test the function of the semiconductor device to determine, for example, whether the memory operation such as data read/write cycle is ordinarily performed or not in the semiconductor memory device. If any defect exists, the semiconductor device is carried to the repair equipment again so that the fuses included in the function blocks of the semiconductor device may be selectively cut for repairing. This repair, for example, includes the repair for row and column repairs in a semiconductor device. After the repair for the function block in semiconductor device is finished, the semiconductor device is carried to the test equipment once again in order to perform the post-test.

As shown, the semiconductor device including the general internal voltage generating circuit has problems in that the semiconductor device must be carried to and from the test equipment and the repair equipment repeatedly and in turn the time for test & repair is needlessly long and the manufacturing process is also needlessly troublesome.

SUMMARY OF THE INVENTION

The present invention is devised for solving the above problems. The object of the present invention is to provide an internal voltage generating circuit of semiconductor device, which is capable of reducing the number of times must be carried the semiconductor device must be carried between a test equipment and a repair equipment during test & repair process.

Another object of the present invention is to provide an internal voltage generating circuit of semiconductor device, which can simplify the process of test & repair.

Still another object of the present invention is to provide a method for generating an internal voltage of semiconductor device.

In accordance with one aspect of the present invention in order to achieve the object, there is provided an internal voltage generating circuit in semiconductor device for converting an external power voltage Vext applied from the semiconductor device into an internal power voltage Vint for driving an internal circuit, comprising: a plurality of test power voltage pads, each of which can be selectively applied with the external power voltage Vext and a ground voltage Vss during test; a fuse programmable control signal generator coupled to the plurality of test power voltage pads, for generating a control signal S according to the signals applied to the plurality of the test power voltage pads during test, and for generating control signal according to the fuse-programmed state after, at least, one fuse included therein is programmed; a reference voltage generator for receiving the external power voltage Vext so as to produce a reference voltage Vr1 having a predetermined level; and a voltage trimming unit for trimming the reference voltage Vr1 in accordance with the output of the fuse programmable control signal generator.

The internal voltage generating circuit in semiconductor device may further comprise an internal voltage driver for receiving the output of the voltage level trimming unit so as to produce the internal power voltage Vint for driving the internal circuit. Also, it may further include a reference voltage amplifier coupled between the reference voltage generator and the voltage level trimming unit, for amplifying the reference voltage Vr1 and producing the amplified reference voltage Vr3 to the voltage level trimming unit.

According to one preferred embodiment, the internal voltage generating circuit in semiconductor device further includes: a stress voltage generator for receiving the external power voltage Vext and generating a stress voltage $V_{stress}$ proportional to the external power voltage; and a reference voltage modifying unit for inputting the trimmed reference voltage Vr2 which is output of the voltage level trimming unit and the stress voltage $V_{stress}$, and for producing the trimmed reference voltage Vr2 when the external power voltage is equal to or lower than a predetermined level and for producing the stress voltage $V_{stress}$ when the external power voltage Vext is higher than the predetermined level. At this time, an internal voltage driver for receiving the output of the voltage level trimming unit so as to produce the internal power voltage Vint for driving the internal circuit may be further included. Here, the internal voltage driver may include an operation mode signal generator for generating an operation mode signal representing whether an operation mode of the semiconductor device is active mode or stand-by mode; an active internal voltage driver activated when the operation mode signal represents active mode, so as to generate the internal power voltage for driving the internal circuit, based on the stress reference voltage, the stress reference voltage being the output of the reference voltage modifying unit; and a stand-by internal voltage driver activated irrespective of the operation mode signal, so as to generate the internal power voltage for driving the internal circuit, based on the stress reference voltage.

The fuse programmable control signal generator in one embodiment includes: a fuse circuit block including a plurality of fuse circuits, each of the fuse circuits including a programmable fuse and being coupled to the corresponding test power voltage pad, respectively; and a decoding unit for decoding the output of the fuse circuit block so as to produce the control signal.

Also, the voltage level trimming unit in one embodiment includes: an input node for inputting a voltage to be trimmed; an output node for outputting the trimmed reference voltage Vr2 the level of which is trimmed; a plurality of resistors coupled in series between the input node and the output node; and a plurality of transfer gates, one of which is coupled between the input node and the output node, the others of which are coupled in parallel between the connection point of the resistors and the output node, respectively, each of the transfergates being turned on/off in response to corresponding control signal.

According to another embodiment of the present invention, the fuse programmable control signal generator may include: a test mode signal generator for generating a test mode signal Ptest representing whether the operation mode of the semiconductor device is test mode; a pseudo fuse circuit block activated when the test mode signal represents that the operation mode is test mode, the pseudo fuse circuit block producing a positive output signal(CUT) and a negative output signal (CUTB) based on the signals applied to the plurality of test power voltage pads; a fuse circuit block activated when the test mode signal represents that the operation mode is not test mode and including a plurality of fuses, the fuse circuit block producing the positive output signal and the negative output signal based on the programmed state of the plurality of fuses included therein; and a decoding unit coupled to both the pseudo fuse circuit block and the fuse circuit block so as to decode the positive output and the negative output.

Here, the pseudo fuse circuit unit may include: a plurality of first inverters INV42, INV44 and INV46, each having an input coupled to a corresponding one of the plurality of test power voltage pads TP0, TP1, . . . , TPn; a plurality of first transfer gates T22, T26 and T30, each of which is coupled between the output of corresponding first inverter and the positive outputs CUT0, CUT1, . . . , CUTn and turned on when the test mode signal Ptest represents the test mode; and a plurality of second transfer gates T24, T28 and T32, each of which is coupled between the corresponding test power voltage pad and the negative output and turned on when the test mode signal represents the test mode. Also, the fuse circuit block may include: a PMOS transistor Q48 having a source coupled to the external power voltage and a gate applied with the test mode signal; and a plurality of fuse circuits 342, 344 and 346, each of which includes at least one fuse and is coupled to the drain of the PMOS transistor, so as to input the external power voltage when the test mode signal is "low" and to produce the positive output signal and the negative output signal. based on the programmed state of the fuses included therein.

In accordance with another aspect of the present invention, there is provided a method for generating an internal voltage of semiconductor device by converting an external power voltage applied to the semiconductor device, the internal voltage being used for driving an internal circuit included in the semiconductor device, the method comprising the steps of: generating a reference voltage having a predetermined level based on the external power voltage; generating an internal power voltage based on the reference voltage; measuring the internal power voltage; comparing the measured internal power voltage with a preferred internal power voltage; generating a trimming control signal by selectively applying the external power voltage or a ground voltage through a plurality of test power voltage pads, based on the result of the step for comparing; generating a trimmed reference voltage Vr2 by trimming the level of the reference voltage in response to the trimming control signal; and generating a trimmed internal power voltage based on the trimmed reference voltage Vr2. Also, the steps of testing the internal circuit while the internal circuit is driven by the trimmed internal power voltage; and programming at least one fuse for generating a control signal such that the control signal is the same as the trimming control signal, after the step of testing, may be further included. Preferably, the internal circuit is simultaneously repaired with the step of programming.

In preferred embodiments, the step of amplifying the reference voltage before the step of generating the trimmed reference voltage and after the step of generating the reference voltage, can be further included, and the trimmed reference voltage can be generated by trimming the amplified reference voltage in accordance with the trimming control signal. Here, the step of generating the internal power voltage which is performed before the step of measuring, may comprise the steps of: generating a measurement control signal by applying the plurality of test power voltage pads with the external power voltage as default signal; and trimming the amplified reference voltage in accordance with the measurement control signal.

According to one preferred embodiment, the steps of: generating a stress voltage proportional to the external power voltage; and generating a stress reference voltage by combining the trimmed reference voltage with the stress reference voltage, can be further included, and the internal power voltage for driving the internal circuit can be generated based on the stress reference voltage.

BRIEF DESCRIPTION OF THE DRAWINGS

For a more complete understanding of the present invention and the advantage thereof, reference is now made to the following description taken in conjunction with the accompanying drawings in which.

DETAILED DESCRIPTION OF THE PRESENT INVENTION

Hereinafter, for explaining in detail in such a manner that the present invention may easily be carried out by a person having ordinary skill in the art to which the present pertains invention, the preferred embodiments of the present invention will be described with reference to the accompanying drawings.

Figure 1:
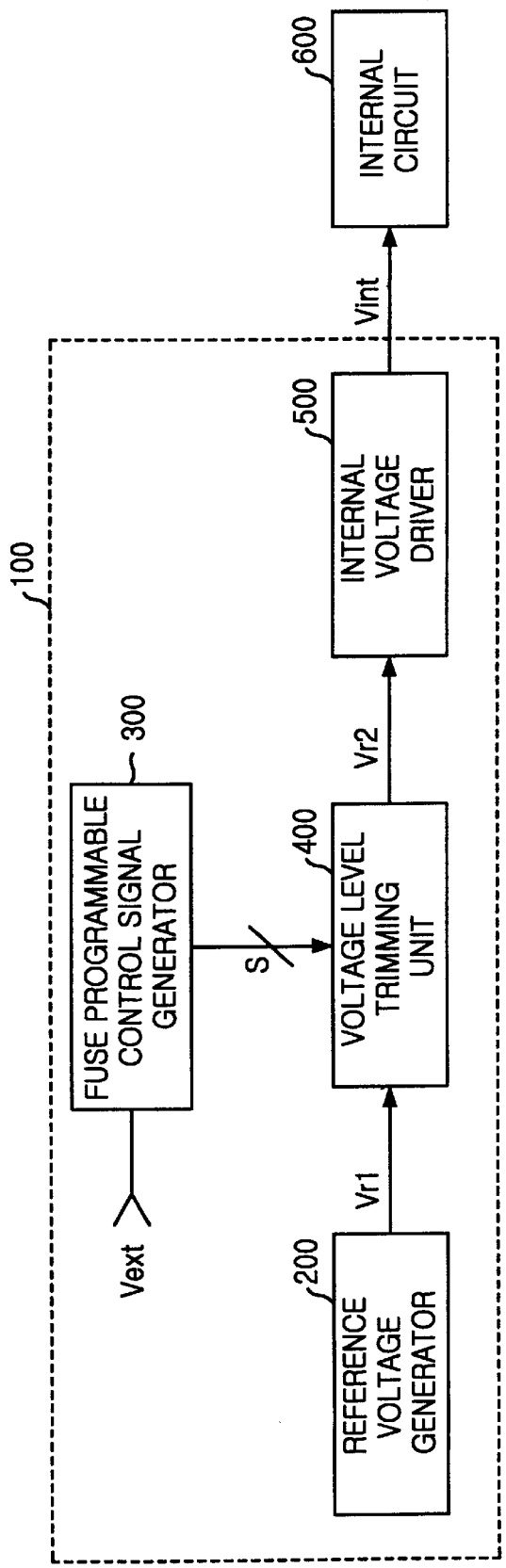
FIG. 1 is a block diagram of a conventional internal voltage generating circuit of semiconductor device.
Figure 2:
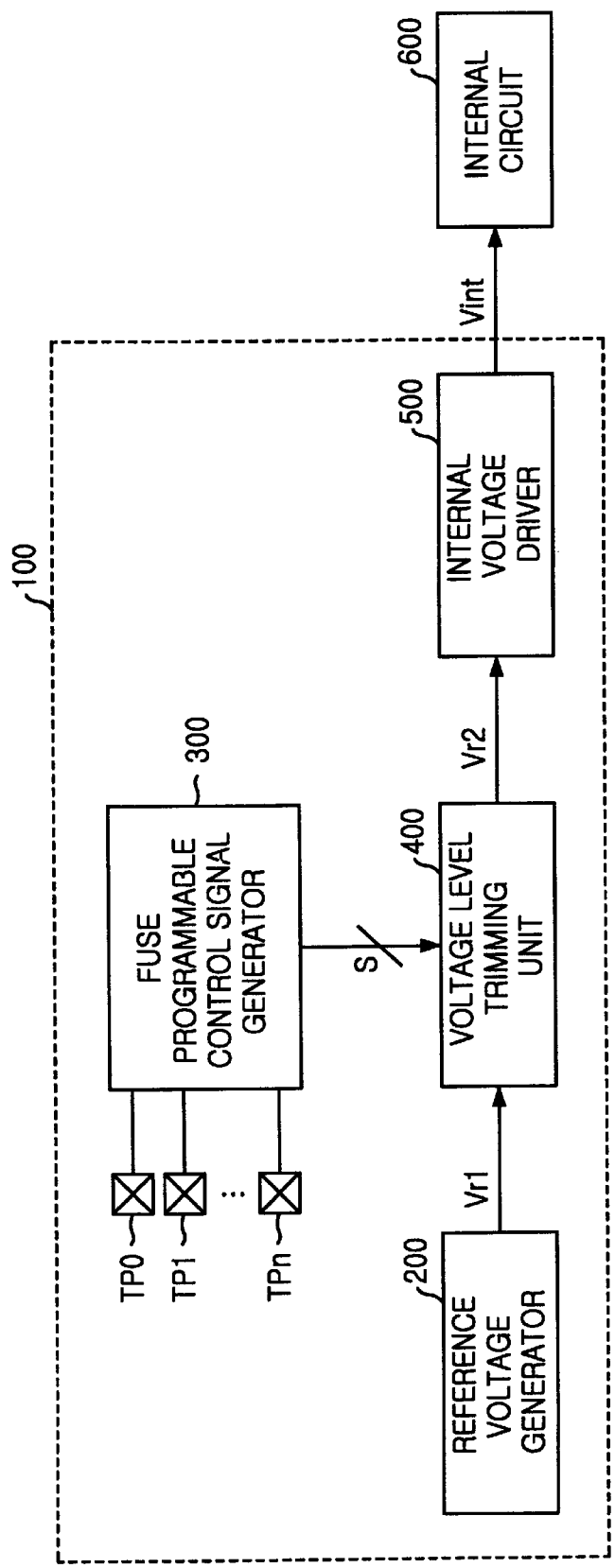
FIG. 2 is a block diagram illustrating an internal voltage generating circuit of semiconductor device, according to one preferred embodiment of the present invention.

FIG. 2 is a block diagram illustrating an internal voltage generating circuit of semiconductor device, according to one preferred embodiment of the present invention.

Referring to FIG. 2, the internal voltage generating circuit 100 includes a plurality of test power voltage pads TP0, TP1, . . . , TPn, a fuse programmable control signal generator 300, a reference voltage generator 200, a voltage level trimming unit 400, and an internal voltage driver 500. The internal power voltage Vint generated from the internal voltage generating circuit 100 is applied to the internal circuit 600.

The reference voltage generator 200 generates the reference voltage Vr1 using the external power voltage Vext which is applied from outside of the semiconductor device. The external power voltage Vext, for example, may be 3.3 Volts and the reference voltage Vr1 would not depend on the external power voltage Vext and temperature. The reference voltage Vr1 is, for example, 0.77 volts. The voltage level trimming unit 400 produces the trimmed reference voltage Vr2 by trimming the level of the reference voltage Vr1 according to the control signal S. The trimmed reference voltage Vr2 may be, for example, 2.77 volts.

In a specific embodiment, when the external power voltage Vext is lower than a predetermined level Vth1, for example, 2.6 volts, the trimmed reference voltage Vr2 may be controlled to be the same voltage level as the external power voltage Vext. In contrast, when the external power voltage Vext is higher than 2.6 volts, the trimmed reference voltage Vr2 may be trimmed to a predetermined level(e.g. 2.77 volts).

Figure 5:
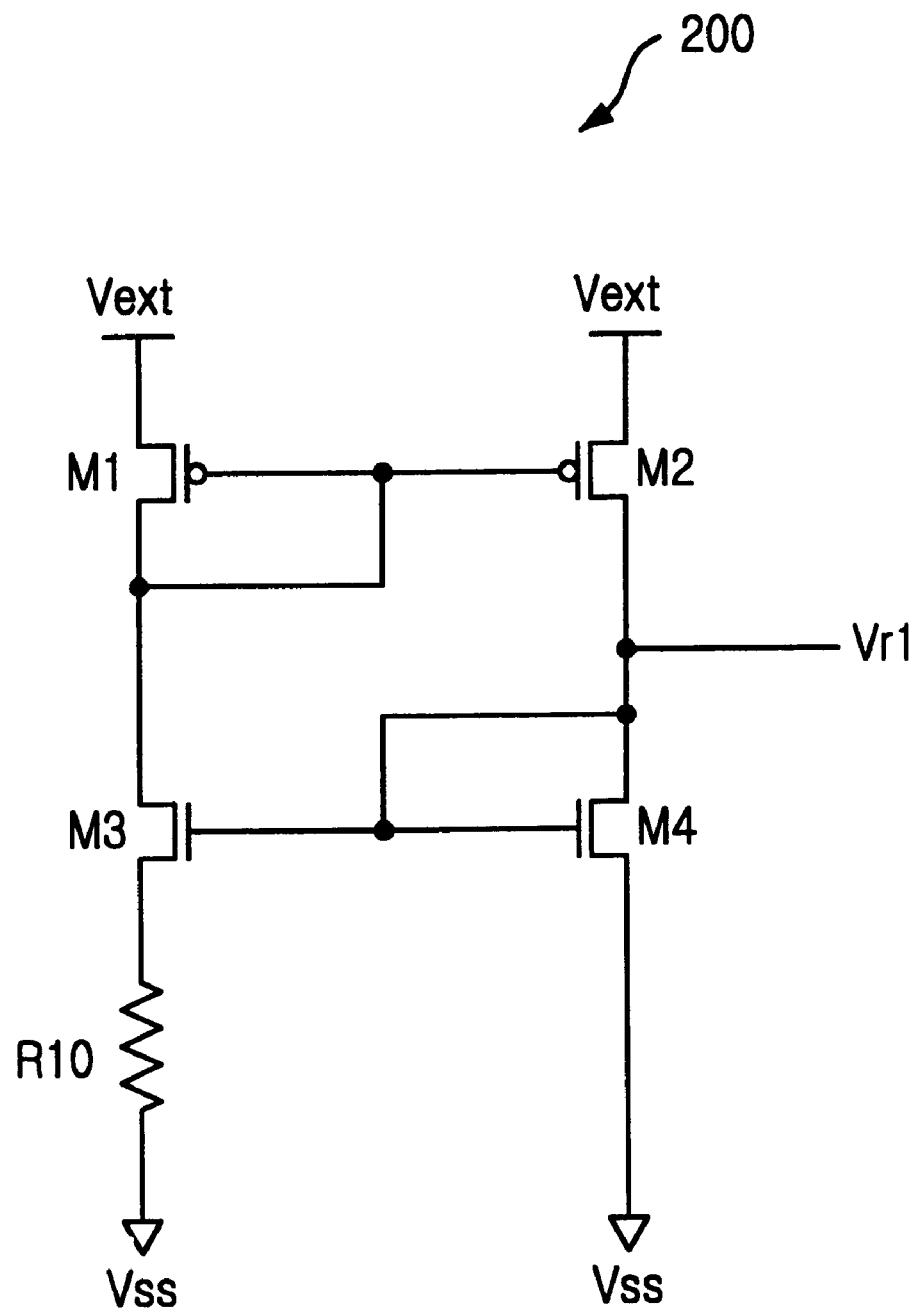
FIG. 5 is a detailed circuit diagram which illustrates one example of the reference voltage generating unit shown in FIGS. 2 to 4.

FIG. 5 is a detailed circuit diagram which illustrates one example of the reference voltage generator 200, which is composed of two PMOS transistors M1 and M2, two NMOS transistors M3 and M4, and a resistor R10. In FIG. 5, the gate of PMOS transistor M1 is commonly coupled to the gate of PMOS transistor M2 and the drain thereof. The drain of PMOS transistor M2 functions as an output node of the reference voltage generator 200 and is commonly coupled to the drain and the gate of NMOS transistor M4. The resistor R10 is coupled between the source of NMOS transistor M3 and the ground voltage Vss. The reference voltage generator 200 configured as such, can generate the reference voltage Vr1, the level of which is stable irrespective of the variation of the external power voltage Vext and temperature.

Referring back to FIG. 2, the multiple test power voltage pads TP0, TP1, . . . , TPn are coupled to the fuse programmable control signal generator 300. At test stage, the multiple fuses included in the fuse programmable control signal generator 300 have not yet programmed. In case that the programming is performed, for example, by selectively cutting the fuses, the multiple fuses should remain uncut at the test stage for trimming the internal power voltage Vint. In this state, the signals which are the same as those generated when the fuses are programmed (that is as if the fuses were selectively cut) are applied through the test power voltage pads TP0, TP1, . . . , TPn.

Specifically, while applying the external power voltage Vext through test power voltage pads TP0, TP1, . . . , TPn, the internal power voltage Vint is produced from the internal voltage driver 500. At this time, the level of internal power voltage Vint may be the desired voltage level. If the level of internal power voltage Vint is not the desired voltage level, it is determined how much the voltage level is trimmed. Then, based on the determined trimming degree, the multiple test power voltage pads TP0, TP1, . . . , TPn are applied with selectively the external power voltage Vext or the internal power voltage Vint. By doing this, the multiple control signals S can be selectively activated, as if the fuses were programmed.

In addition, the test for function block(s) is performed to account for the condition that the multiple fuses included in the fuse programmable control signal generator 300 are not programmed. At this time, the multiple test power voltage pads TP0, TP1, . . . , TPn are selectively applied with one of the external power voltage Vext and the ground voltage Vss depending on the level of trimming degree as described above.

Here, the number of the multiple test power voltage pads TP0, TP1, . . . , TPn can be changed depending upon the level of trimming degree. For example, the control signal S is $8(=2^3)$ and the trimmed voltage level is one of eight voltage levels, in case that the test power voltage pads TP0, TP1, . . . , TPn are three(that is n=3). Likewise, if the number of the test power voltage pads TP0, TP1, . . . , TPn is four, the number of the control signals S is $16(=2^4)$ and the trimmed voltage level is one of 16 voltage levels.

Figure 3:
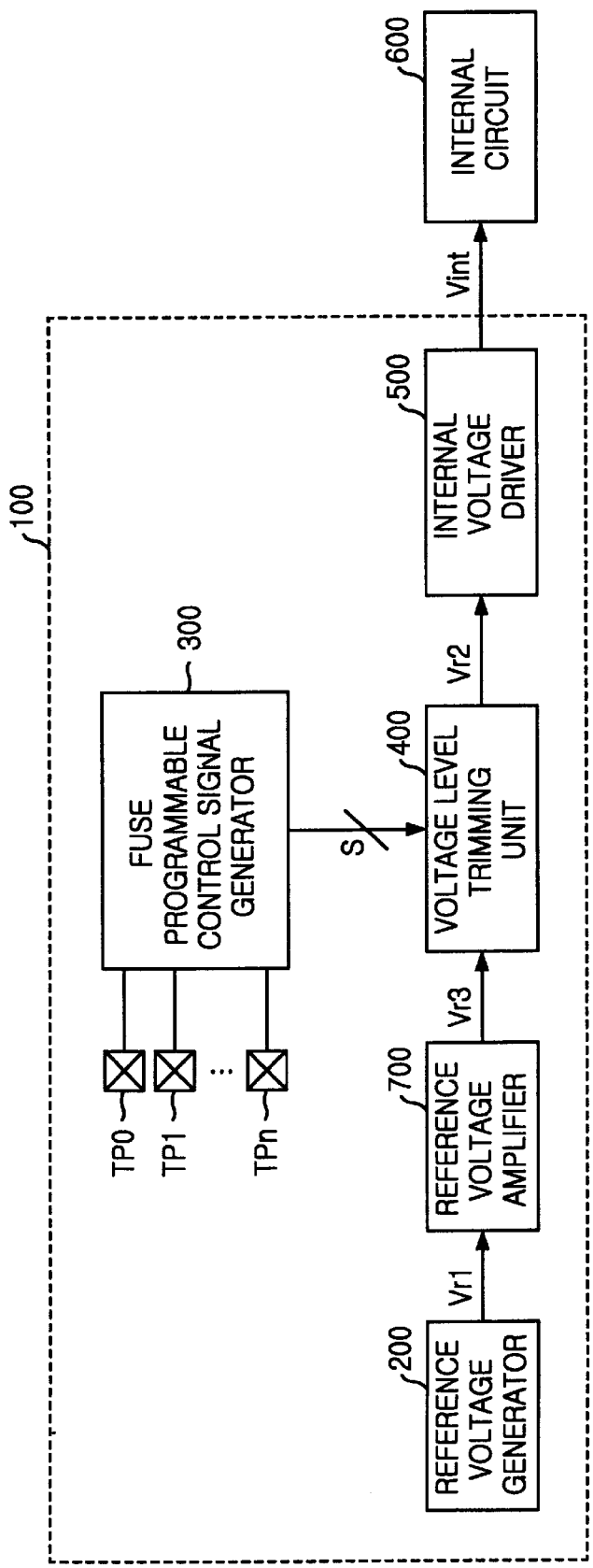
FIG. 3 is a block diagram illustrating an internal voltage generating circuit of semiconductor device, according to another preferred embodiment of the present invention.

FIG. 3 is a block diagram illustrating an internal voltage generating circuit of semiconductor device, according to another preferred embodiment of the present invention.

In FIG. 3, the same elements with those of FIG. 2 have the same reference numerals and the explanation thereof will be omitted. Referring to FIG. 3, the internal voltage generating circuit 100 further comprises a reference voltage amplifier 700 coupled between reference voltage generator 200 and voltage level trimming unit 400.

The reference voltage amplifier 700 may be composed of, for example, a differential amplifier and amplifies the reference voltage Vr1, which is the output of the reference voltage generator 200, so as to produce the amplified reference voltage Vr3. In this configuration, the test for level of trimming of the internal power voltage Vint & the test for function blocks may be performed as explained in FIG. 2.

In another embodiment of the present invention, the reference voltage amplifier 700 of FIG. 3 may be coupled between the voltage level trimming unit 400 and the internal voltage driver 500. In this case, the reference voltage amplifier 700 amplifies the trimmed reference voltage Vr2 so as to apply the amplified reference voltage to the internal voltage driver 500.

Figure 4:
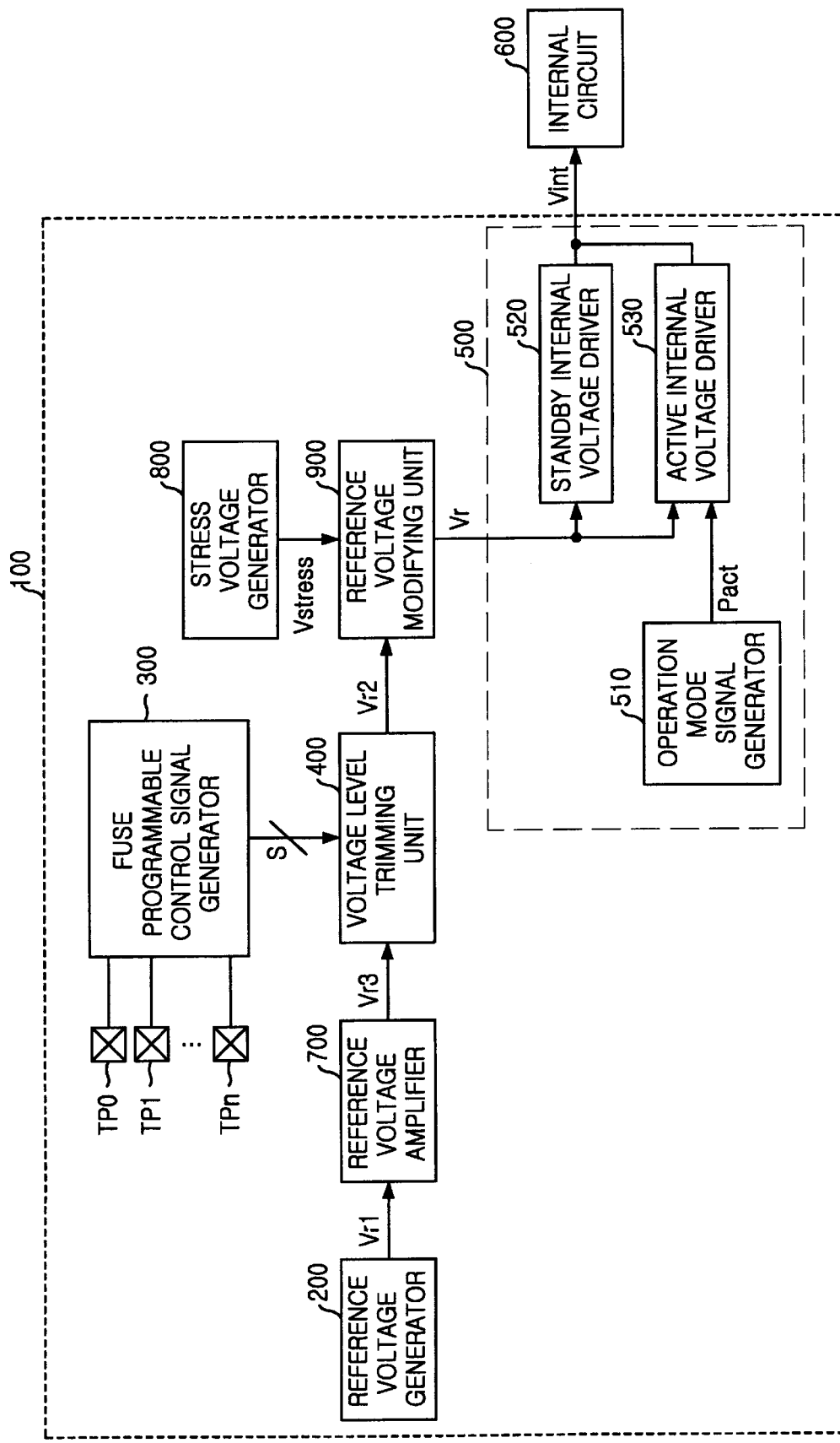
FIG. 4 is a block diagram illustrating an internal voltage generating circuit of semiconductor device, according to still another preferred embodiment of the present invention.

FIG. 4 is a block diagram illustrating an internal voltage generating circuit of semiconductor device, according to still another preferred embodiment of the present invention. In FIG. 4, the same elements with those of FIGS. 2 and 3, have the same reference numerals and the explanation thereof will be omitted.

Referring to FIG. 4, the internal voltage generating circuit 100 includes the reference voltage generator 200, the reference voltage amplifier 700, the fuse programmable control signal generator 300, the plurality of test power voltage pads TP0, TP1, . . . , TPn, the voltage level trimming unit 400, the internal voltage driver 500, a stress voltage generator 800, and a reference voltage modifying unit 900 and the internal power voltage Vint generated from the internal voltage driver 500 is applied to the internal circuit 600 to be driven.

In FIG. 4, the stress voltage generator 800 receives the external power voltage Vext so as to produce the stress voltage $V_{stress}$. The stress voltage $V_{stress}$ is substantially the same as the ground voltage Vss when the external power voltage Vext is equal to or lower than a predetermined level(i.e. threshold level Vth1), while the stress voltage $V_{stress}$ is increased in proportion with the external power voltage Vext when the external power voltage Vext is higher than the threshold level Vth1. Here, the threshold level Vth1 is preferably set below the internal power voltage Vint. In this case, the stress voltage $V_{stress}$ has the characteristics in that it is linearly increased with the external power voltage Vext and it may be used for so-called 'stress mode' or 'burn-in mode'.

The reference voltage modifying unit 900 generates the stress reference voltage Vr based on the trimmed reference voltage Vr2 from the voltage level trimming unit 400 and the stress voltage $V_{stress}$ from the stress voltage generator 800. In one preferred embodiment, the stress reference voltage Vr is substantially the same as the trimmed reference voltage Vr2 when the external power voltage Vext is lower than a threshold level Vth2(e.g. 4.6 volts), while the stress reference voltage Vr is substantially the same as the stress voltage $V_{stress}$ when external power voltage Vext is higher than the threshold level Vth2(e.g. 4.6 volts). Here, the threshold level Vth2 is preferable set higher than the internal power voltage Vint.

In FIG. 4, the internal voltage driver 500 includes a operation mode signal generator 510, a standby internal voltage driver 520 and an active internal voltage driver 530.

The operation mode signal generator 510 generates a operation mode signal Pact representing whether the operation mode of the semiconductor device is active mode or standby mode, based on the signals applied from the outside of the semiconductor device, such as /CAS, /RAS, /WE and etc. in a semiconductor memory device. In one embodiment, the operation mode signal Pact is "high" level for 'active mode' and "low" level for 'standby mode'. In the embodiment shown in FIG. 4, the standby internal voltage driver 520 is always activated irrespective of the operation mode, while the active internal voltage driver 530 is activated only when the operation mode signal Pact is "high" level or 'active mode'. Thus, only the standby internal voltage driver 520 generates the internal power voltage Vint based on the stress reference voltage Vr in 'standby model', while both the standby internal voltage driver 520 and the active internal voltage driver 530 are activated so as to produce the internal power voltage Vint.

Here, the standby internal voltage driver 520 may be composed of a voltage follower for improving the current drivability. In standby mode, the internal power voltage Vint, which is the output of the standby internal voltage driver 520, can be used for driving, for example, a/RAS buffer, a/CAS buffer, a bit line precharge voltage $V_{BLP}$ generator, a reference voltage $V_{REF}$ generator, a $V_{BB}$ level generator and so forth in a semiconductor memory device.

The active internal voltage driver 530 can be also composed of a voltage follower. In this case, it is preferable that the current drivability of the active internal voltage driver 530 is set to be higher than that of the standby internal voltage driver 520.

Figure 6:
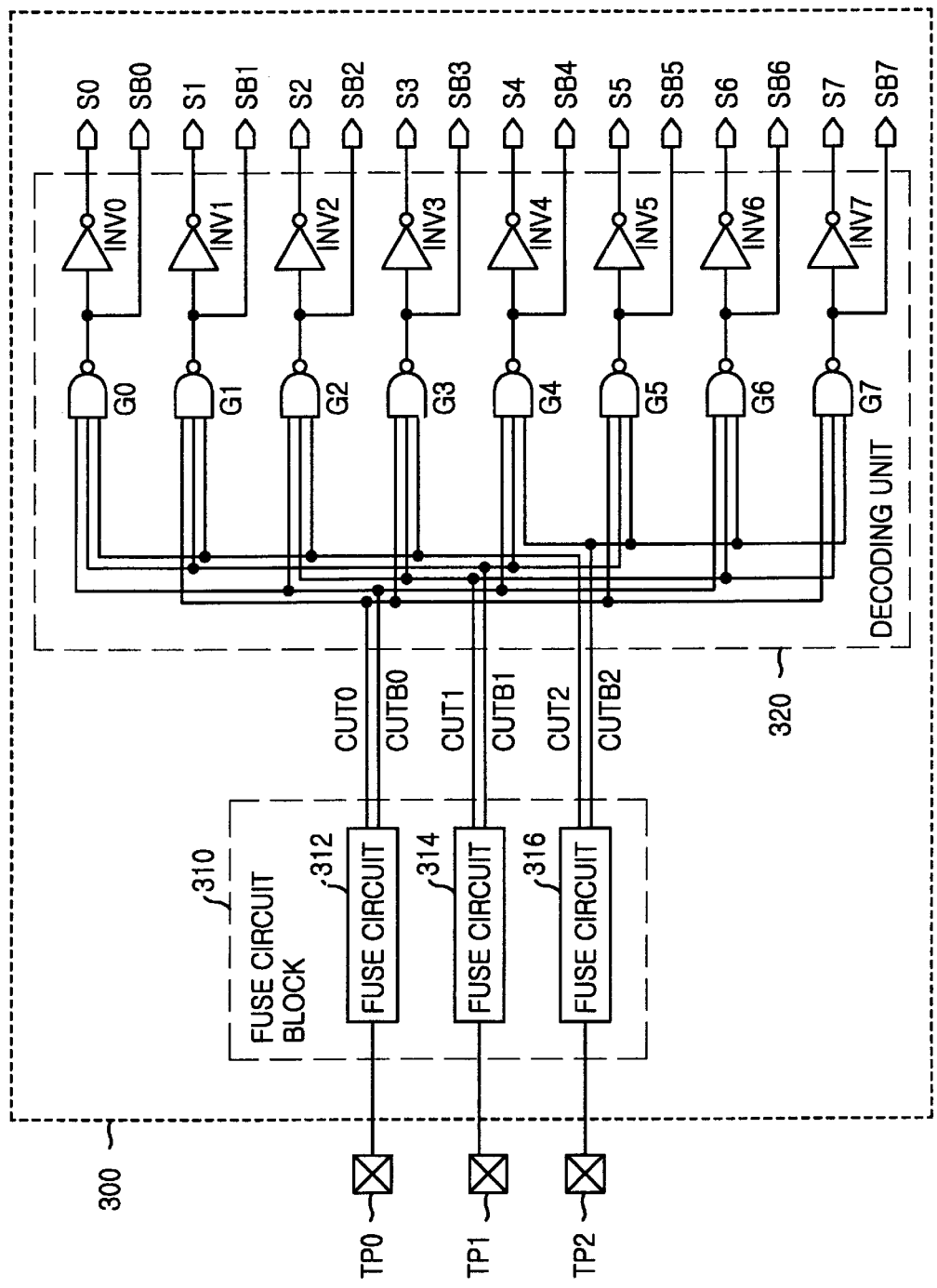
FIG. 6 is a detailed circuit diagram which illustrates one example of the fuse programmable control signal generator shown in FIGS. 2 to 4.

FIG. 6 is a detailed circuit diagram which illustrates one example of the fuse programmable control signal generator shown in FIGS. 2 to 4.

Referring to FIG. 6, the fuse programmable control signal generator 300 includes a fuse circuit block 310 and a decoding unit 320.

The fuse circuit block 310 includes a plurality of fuse circuits 312, 314 and 316, which are coupled to the test power voltage pads TP0, TP1 and TP2, respectively. Each of the fuse circuits 312, 314 and 316 has at least one fuse so that the output thereof can be varied in accordance with the programmed state of the fuse. For example, the fuse is connected at initial stage and then can be selectively disconnected (or cut) by programming. The fuse circuits 312, 314 and 316 have corresponding positive outputs CUT0, CUT1 and CUT2 and negative outs CUTB0, CUTB1 and CUTB2, respectively. The positive outputs CUT0, CUT1 and CUT2 can be varied in accordance with the signals applied to the test power voltage pads TP0, TP1 and TP2, respectively, when the fuses are connected. Meanwhile, when the fuses are disconnected by programming, the positive outputs CUT0, CUT1 and CUT2 are substantially the same as the ground voltage Vss. The decoding unit 320 includes eight NAND gates G0, G1, G2, G3, G4, G5, G6 and G7, and eight inverters INV0, INV1, INV2, INV3, INV4, INV5, INV6 and INV7. The decoding unit 320 configured like this, produces a plurality of control signals S0, S1, S2, S3, S4, S5, S6 and S7 and a plurality of inverted control signals SB0, SB1, SB2, SB3, SB4, SB5, SB6 and SB7, based on the positive outputs CUT0, CUT1 and CUT2 (or the negative outputs CUTB0, CUTB1 and CUTB2). One of the control signals S0, S1, S2, S3, S4, S5, S6 and S7 and one of inverted control signals SB0, SB1, SB2, SB3, SB4, SB5, SB6 and SB7 are active(e.g. Vext) in response to the positive outputs CUT0, CUT1 and CUT2 (or the negative outputs CUTB0, CUTB1 and CUTB2), as the following table.

voltage Vr2 has a voltage level according to the following equation (1).

$$Vr2 = \frac{(R5 + R6 + R7 + R8)Vr3}{R0 + R1 + R2 + R3 + R4 + R5 + R6 + R7 + R8} \quad (1)$$

Here, if the resistance of the resistors R0, R1, R2, R3, R4, R5, R6, R7 and R8 is the same, the trimmed reference voltage Vr2 is as the following equation (2)

$$Vr2 = \frac{4}{9} \cdot Vr3 \quad (2)$$

In addition, for accurately performing the voltage level trimming in a specific range, the resistance of R7 and R8 may be set much higher than that of R0 to R6.

| INPUT | | | OUTPUT | | | | | | | |
|---|---|---|---|---|---|---|---|---|---|---|
| CUT2 | CUT1 | CUT0 | S0 | S1 | S2 | S3 | S4 | S5 | S6 | S7 |
| Vss | Vss | Vss | Vext | Vss | Vss | Vss | Vss | Vss | Vss | Vss |
| Vss | Vss | Vext | Vss | Vext | Vss | Vss | Vss | Vss | Vss | Vss |
| Vss | Vext | Vss | Vss | Vss | Vext | Vss | Vss | Vss | Vss | Vss |
| Vss | Vext | Vext | Vss | Vss | Vss | Vext | Vss | Vss | Vss | Vss |
| Vext | Vss | Vss | Vss | Vss | Vss | Vss | Vext | Vss | Vss | Vss |
| Vext | Vss | Vext | Vss | Vss | Vss | Vss | Vss | Vext | Vss | Vss |
| Vext | Vext | Vss | Vss | Vss | Vss | Vss | Vss | Vss | Vext | Vss |
| Vext | Vext | Vext | Vss | Vss | Vss | Vss | Vss | Vss | Vss | Vext |

Figure 7:
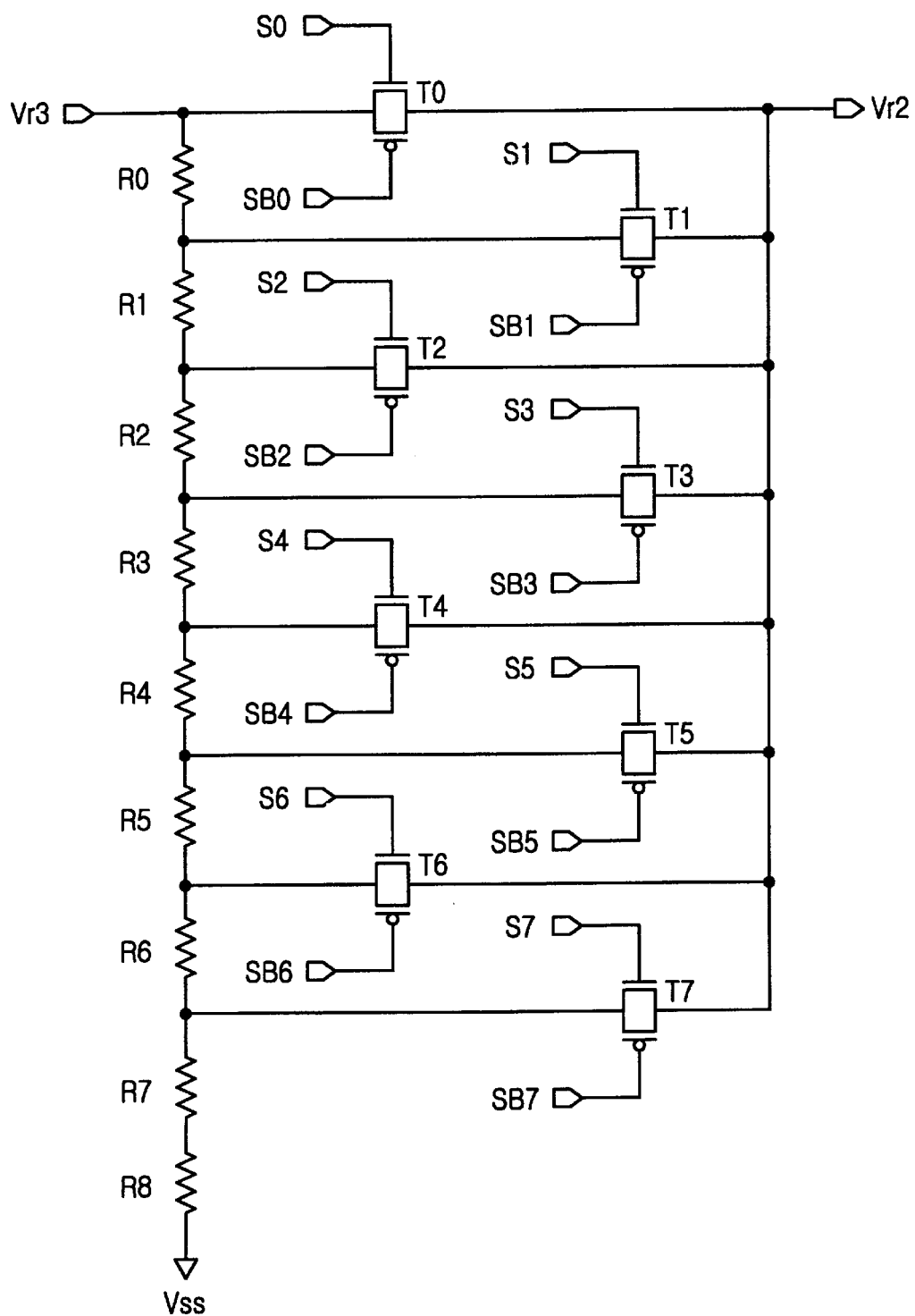
FIG. 7 is a detailed circuit diagram which illustrates one example of the voltage level trimming unit shown in FIGS. 2 to 4.

The control signals S0, S1, S2, S3, S4, S5, S6 and S7 and the inverted control signals SB0, SB1, SB2, SB3, SB4, SB5, SB6 and SB7 as above, are applied to the voltage level trimming unit 400 as shown in FIG. 7.

FIG. 7 is a detailed circuit diagram which illustrates one example of the voltage level trimming unit, which may be implemented by a so-called voltage divider composed of a plurality of resistors. In more detail, the voltage level trimming unit 400 of FIG. 7 includes a plurality of resistors R0, R1, R2, R3, R4, R5, R6, R7 and R8, and a plurality of transfer gates T0, T1, T2, T3, T4, T5, T6 and T7. Each of transfer gates T0, T1, T2, T3, T4, T5, T6 and T7 is composed of a PMOS transistor and an NMOS transistor, the drain and source of which are common to each other. The resistors R0, R1, R2, R3, R4, R5, R6, R7 and R8 are coupled in series between the input node applied with the amplified reference voltage Vr3, and the ground voltage Vss. The transfer gates T0, T1, T2, T3, T4, T5, T6 and T7 are coupled. between the input node and the output node for producing the trimmed reference voltage Vr2; between the connection points of the resistors and the output node, respectively. The control signals S0, S1, S2, S3, S4, S5, S6 and S7 and the inverted control signals SB0, SB1, SB2, SB3, SB4, SB5, SB6 and SB7 are applied to the corresponding gate of the transfer gates T0, T1, T2, T3, T4, T5, T6 and T7 for switching control. Thus, the amplified reference voltage Vr3 is trimmed according to the activated one of the control signals S0, S1, S2, S3, S4, S5, S6 and S7, so as to produce the trimmed reference voltage Vr2. For example, if the control signal S0 is activated to "high", the amplified reference voltage Vr3 is produced as the trimmed reference voltage Vr2 without any trimming. In contrast, if the control signal S5 is activated to "high" level, the trimmed references FIG. 8 is a detailed circuit diagram which illustrates one example of the fuse circuit 312 shown in FIG. 6 and the other fuse circuits 314 and 316 can also be implemented with the same configuration.

Figure 8:
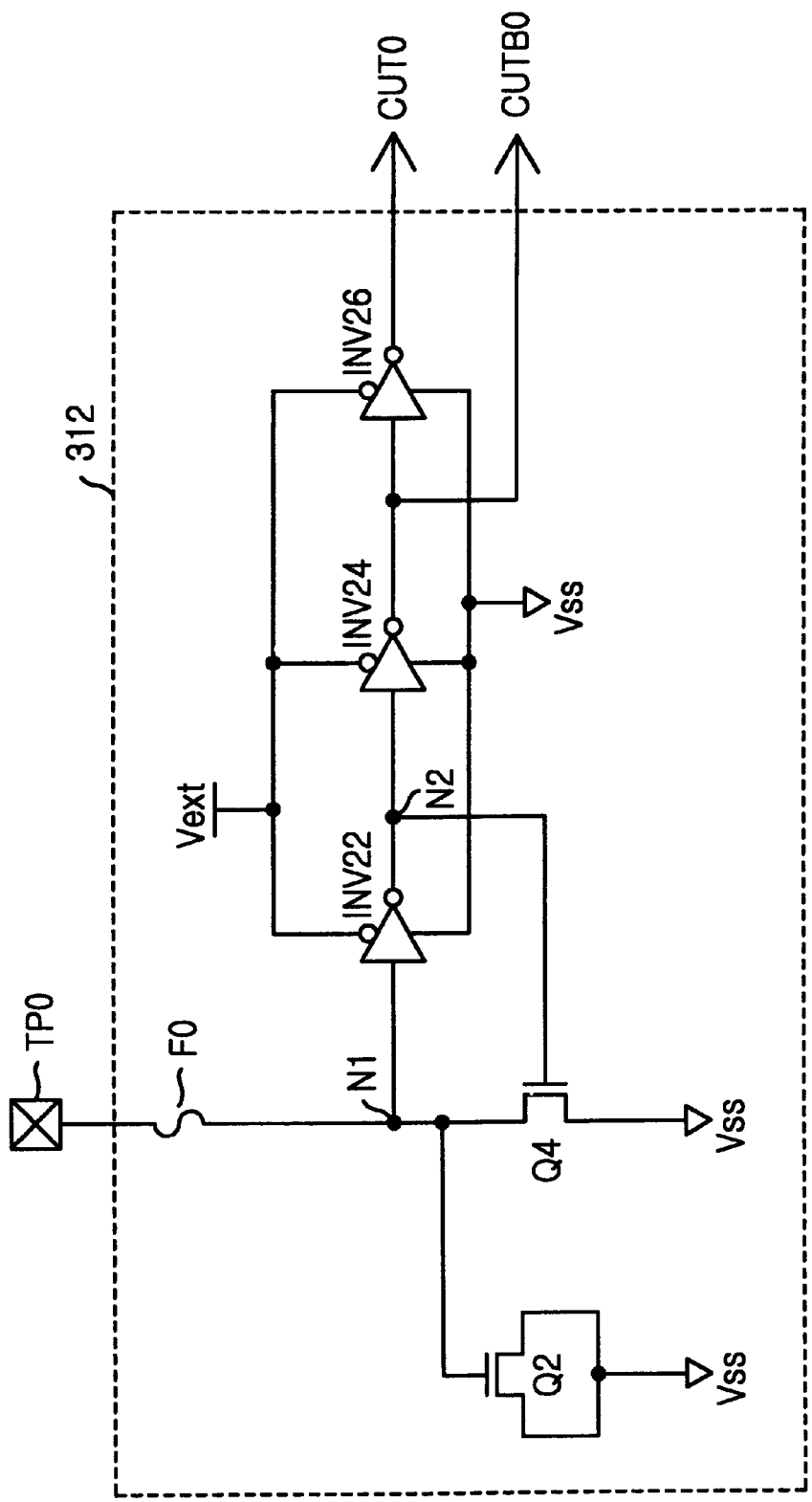
FIG. 8 is a detailed circuit diagram which illustrates one example of the fuse circuit shown in FIG. 6.

Referring to FIG. 8, the fuse F0 is coupled between the test power voltage pad TP0 and the node N1. The source and the drain of NMOS transistor Q2 are commonly coupled to the ground voltage Vss and the gate thereof is coupled to the node N1, so that the Q2 functions as a capacitor. The source-drain path of NMOS transistor Q4 is coupled between the node N1 and the ground voltage Vss and the gate of NMOS transistor Q4 is coupled to the node N2. The inverters INV22, INV24 and INV26 are coupled in series and applied with external power voltage Vext and the ground voltage Vss, so as to function as a buffer. Also, the output of the inverter INV26 is produced as the positive output CUT0 of the fuse circuit 312 and the output of the inverter INV24 is produced as the negative output CUTB0 of the fuse circuit 312.

The operation of the fuse circuit 312 configured like this, will be explained. First, we will consider that the fuse F0 is not connected. When the fuse F0 is not cut, the node N1 represents the signal which is applied to the test power voltage pad TP0. Accordingly, if the test power voltage pad TP0 is applied with the external power voltage Vext, the node N1 represents the same voltage level as that of the external power voltage Vext. The inverter INV22 inverts the node N1 so that the output of INV22 is "low" level, which in turn NMOS transistor Q4 is continuously turned off. The potential of the node N2 is buffered by the inverters INV24 and INV26 prior to outputting, so that the positive output CUT0 of the fuse circuit 312 is "low" level (e.g. the ground voltage Vss). Also, the negative output CUTB0 of the fuse circuit 312 is "high" level (e.g. the external power voltage Vext).

On the other hand, if the ground voltage Vss is applied to the test power voltage pad TP0 with the fuse F0 being connected, the potential of the node N1 is "low", which is the same as the ground voltage Vss and the node N2; the output of the inverter INV22 is "high" level. Thus, the NMOS transistor Q4 is turned on and the node N1 is stabilized to the ground voltage Vss. The signal of the node N2 is buffered by inverters INV24 and INV26 so as to be produced as "high" level of positive output CUT0. In addition, the output of the inverter INV24 is "low" level.

In contrast, if the fuse 102 is cut, for example, by a laser beam, the node N1 is not affected by the signal applied to the test power voltage pad TP0. The potential of the node N1 is determined based on the charge accumulated on the gate of NMOS transistor Q2, which plays a role of capacitor. Here, the accumulated charge on the node N1 is discharged as time elapses. Thus, if the fuse F0 is cut, the node N1 has no path to be supplied with charge so that the node N1 becomes "low" level. When the node N1 is "low" level, the output of the inverter INV22 is "high" level and in turn the NMOS transistor Q4 is turned on and the node N1 is stabilized to "low" level. Also, the "high" level of the node N2 is buffered by the inverters INV24 and INV26 so as to be produced as the positive output CUT0 and the "low" level output of the inverter INV24 is produced as the negative output CUTB0.

In summary, the output level of the fuse circuit 312 is varied in accordance with the signals applied to the test power voltage pad TP0 when the fuse F0 is not cut, while the positive output CUT0 is "high" level and the negative output CUTB0 is "low" when the fuse F0 is cut. Therefore, without programming the fuse F0, the fuse circuit can be operated as if it is programmed, by selectively applying one of the external power voltage Vext or the ground voltage Vss to the test power voltage pad TP0.

Figure 9:
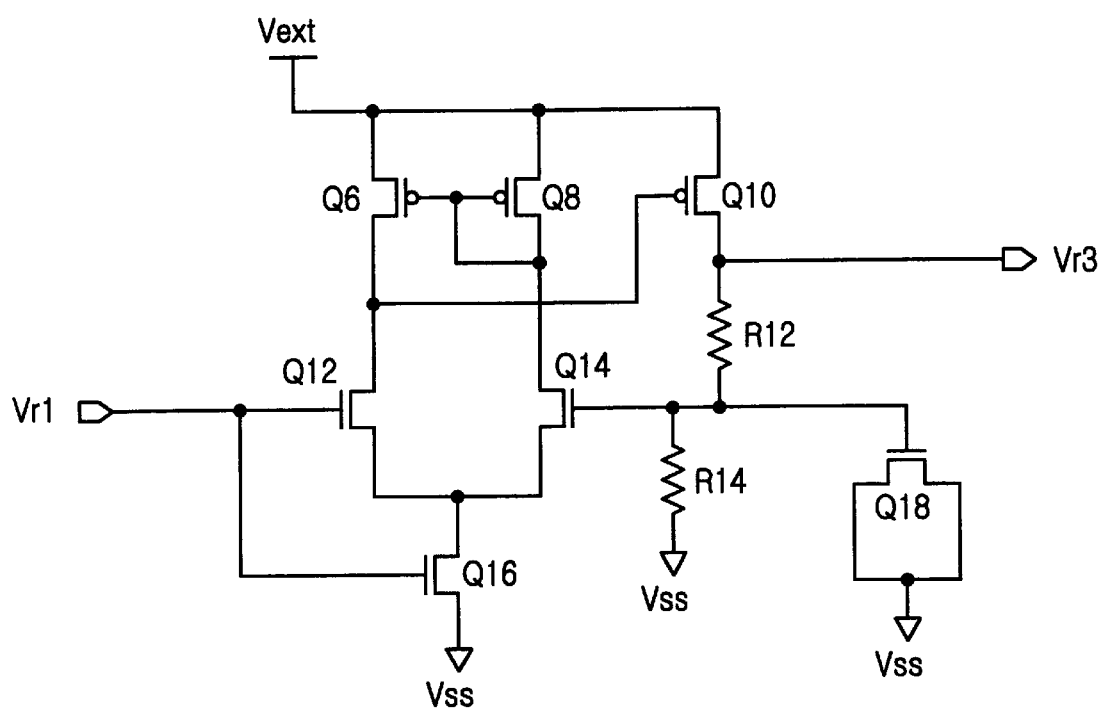
FIG. 9 is a detailed circuit diagram which illustrates one example of the reference voltage amplifier shown in FIGS. 3 and 4.

FIG. 9 is a detailed circuit diagram which illustrates one example of the reference voltage amplifier shown in FIGS. 3 and 4, which is substantially implemented by a differential amplifier. In FIG. 9, the reference voltage amplifier 700 includes three PMOS transistors Q6, Q8 and Q10, NMOS transistors Q12, Q14 and Q16, resistors R12 and R14, and an NMOS transistor Q18, the source and the drain of which are commonly coupled so as to function as a capacitor.

Figure 10:
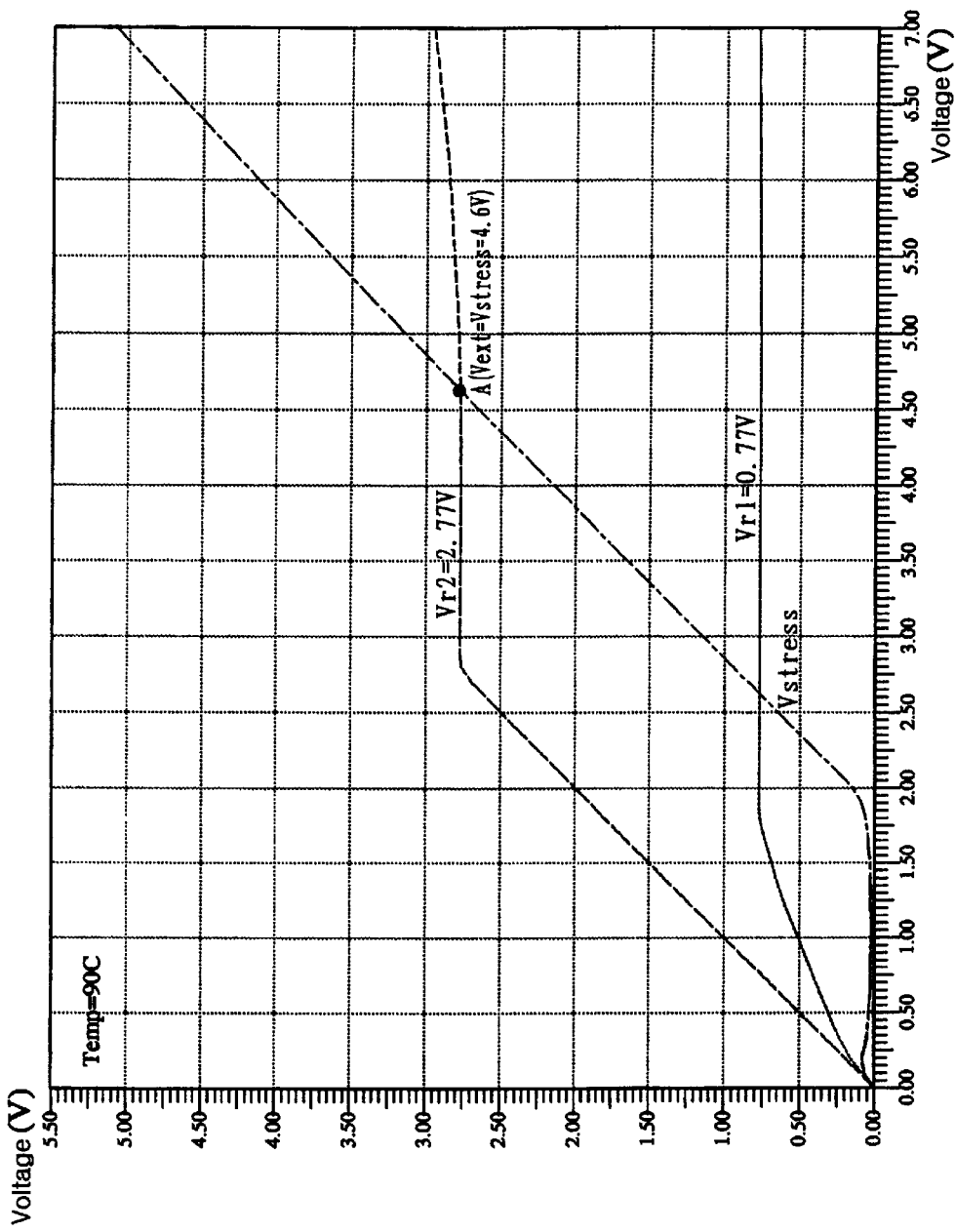
FIGS. 10 and 11 are graphs showing the simulation results of the internal voltage generating circuit in accordance with the present invention.
Figure 11:
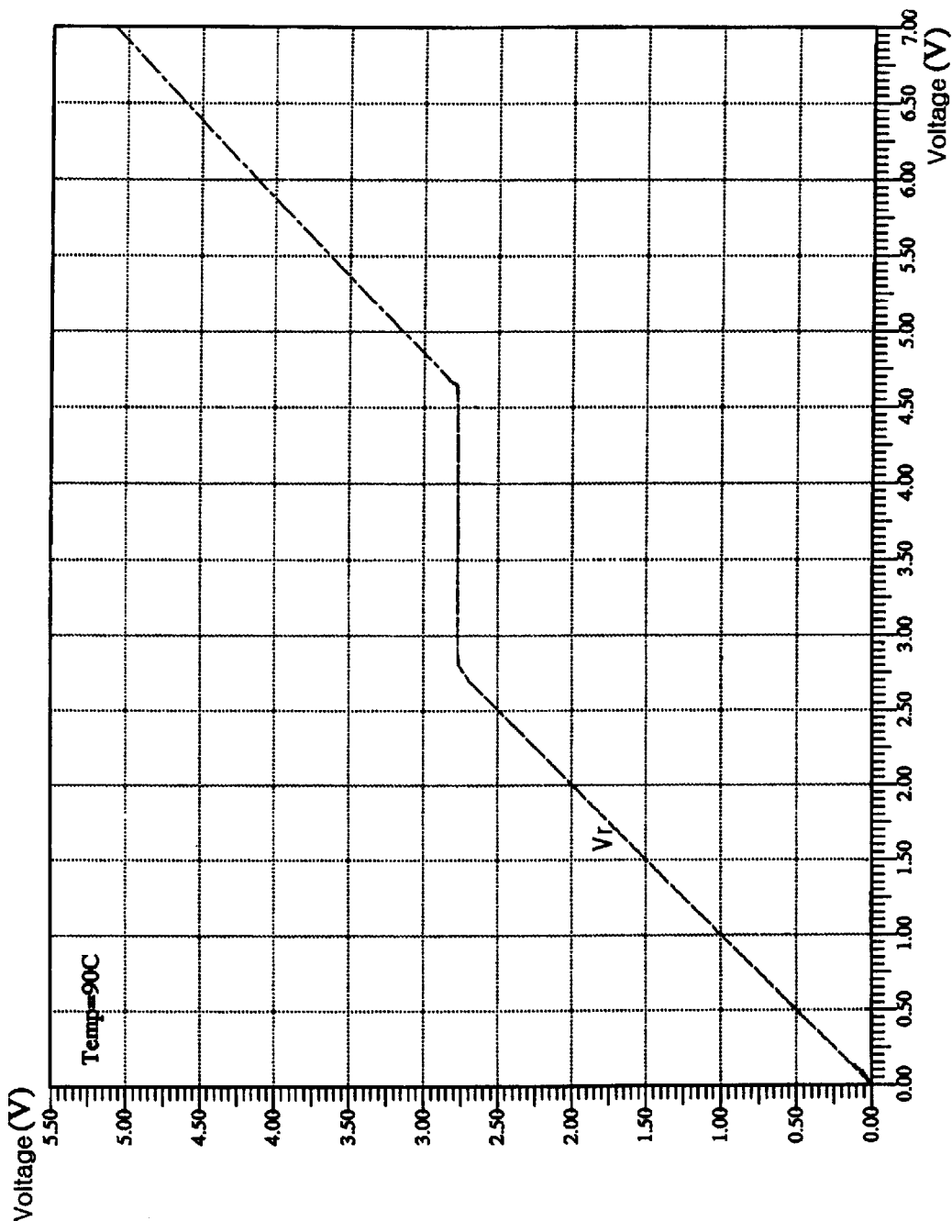

FIGS. 10 and 11 are graphs showing the simulation results of the internal voltage generating circuit in accordance with the present invention. In FIGS. 10 and 11, the horizontal axis represents the external power voltage Vext and the vertical axis represents the voltages, in which the simulation has been performed at 90° C. FIG. 10 illustrates the reference voltage Vr1 that is the output of the reference voltage generator 200, the trimmed reference voltage Vr2 that is the output of the voltage level trimming unit 400, and the stress voltage $V_{stress}$ that is the output of the voltage level trimming unit 400. FIG. 11 illustrates the stress reference voltage Vr that is the output of the reference voltage modifying unit 900.

Figure 12:
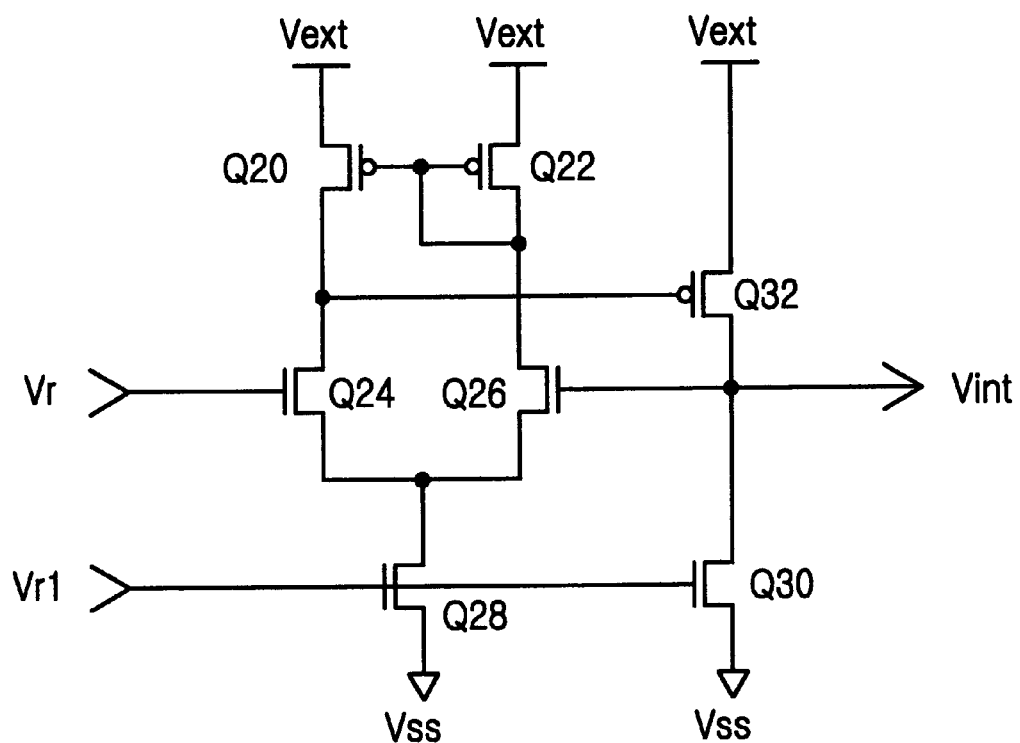
FIG. 12 is a detailed circuit diagram of the stand-by internal voltage driver shown in FIG. 4, according to one preferred embodiment of the present invention.

FIG. 12 is a detailed circuit diagram of the stand-by internal voltage driver 520 shown in FIG. 4, according to one preferred embodiment of the present invention. The standby internal voltage driver 520 includes PMOS transistors Q20, Q22 and Q32, NMOS transistors Q24, Q26, Q28 and Q30. Here, for turning on the NMOS transistors Q28 and Q30, the reference voltage Vr1, the level of which is low, is applied to respective gates, so that the power consumption at the standby internal voltage driver 520 can be reduced.

Figure 13:
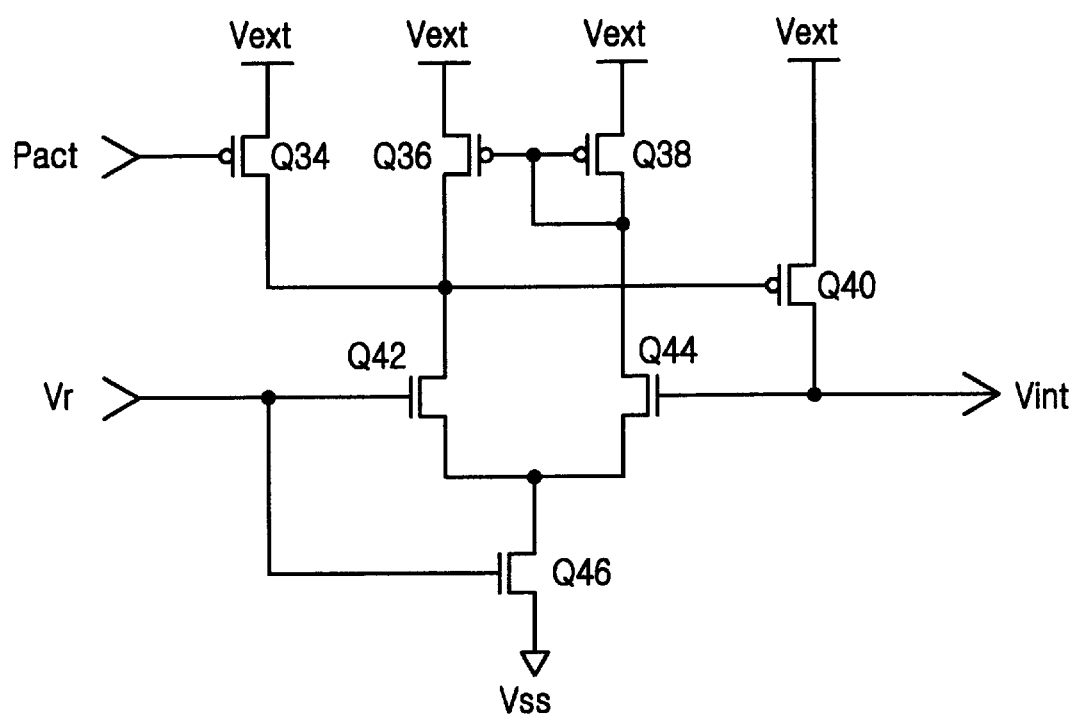
FIG. 13 is a detailed circuit diagram of the active internal voltage driver shown in FIG. 4, according to one preferred embodiment of the present invention.

FIG. 13 is a detailed circuit diagram of the active internal voltage driver 530 shown in FIG. 4, according to one preferred embodiment of the present invention. The active internal voltage driver 530 is composed of PMOS transistors Q34, Q36, Q38 and Q40, and NMOS transistors Q42, Q44 and Q46. By applying the stress reference voltage Vr, the level of which is higher than the reference voltage Vr1, to the gate of NMOS transistors Q42 and Q46, the drivability of active internal voltage driver 530 can be increased. In addition, the active internal voltage driver 530 may in general include a plurality of the circuitry shown in FIG. 13, depending on the size of the internal circuit 600.

Figure 14:
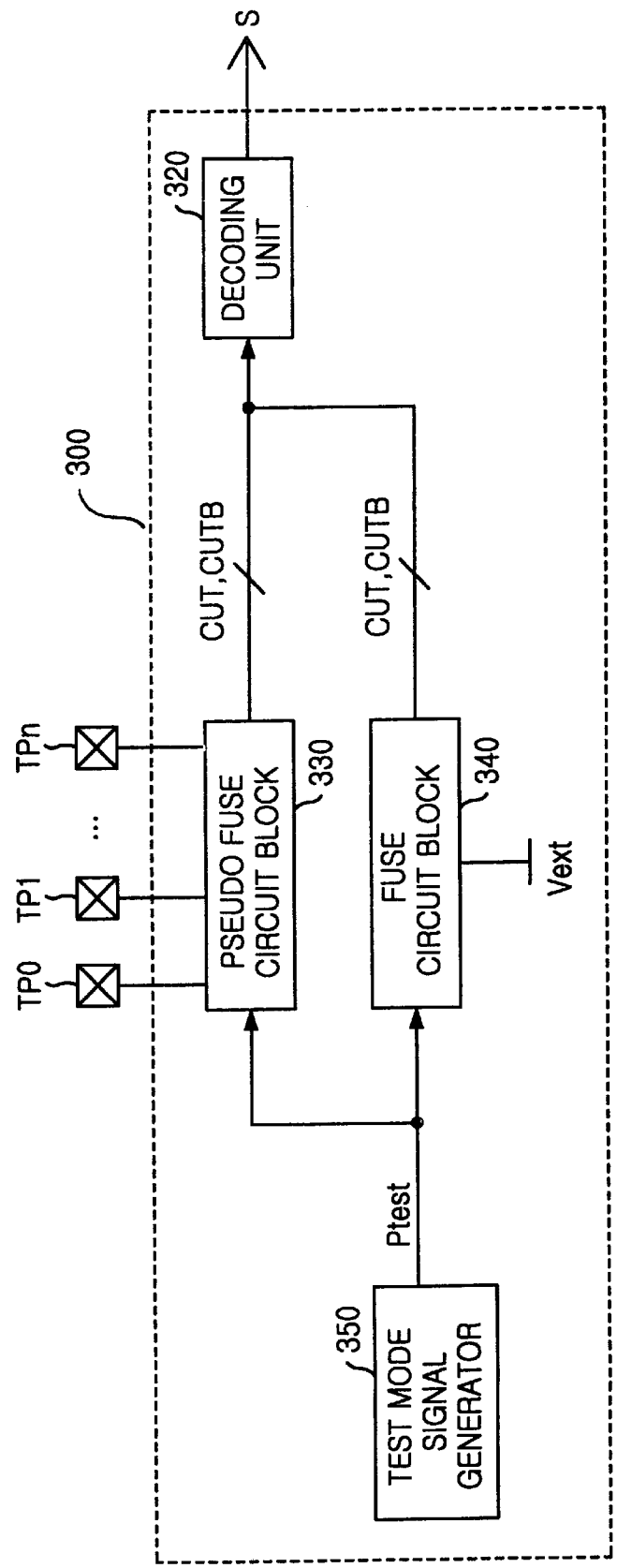
FIG. 14 is a block diagram for illustrating a fuse programmable control signal generator, according to another embodiment of the present invention.

FIG. 14 is a block diagram illustrating a fuse programmable control signal generator, according to another embodiment of the present invention.

Referring to FIG. 14, the fuse programmable control signal generator 300 includes a test mode signal generator 350, a fuse circuit block 340, a pseudo fuse circuit block 330 and the decoding unit 320. The plurality of test power voltage pads TP0, TP1, . . . , TPn are coupled to the pseudo fuse circuit block 330.

The test mode signal generator 350 generates a test mode signal Ptest activated during test mode. The pseudo fuse circuit block 330 is activated in response to the test mode signal Ptest so that it produces the positive output CUT and the negative output CUTB based on the signals applied to the plurality of test power voltage pads TP0, TP1, . . . , TPn.

Meanwhile, the fuse circuit block 340 is activated when the test ode signal Ptest is non-active (or activated except for test mode), so that it produces the positive output CUT and the negative output CUTB in accordance with the programmed state of the fuse included therein.

The outputs of pseudo fuse circuit block 330 and fuse circuit block 340 are wire-ORed so as to be applied to the decoding unit 320. The decoding unit 320 decodes the positive output CUT and the negative output CUTB.

Figure 15:
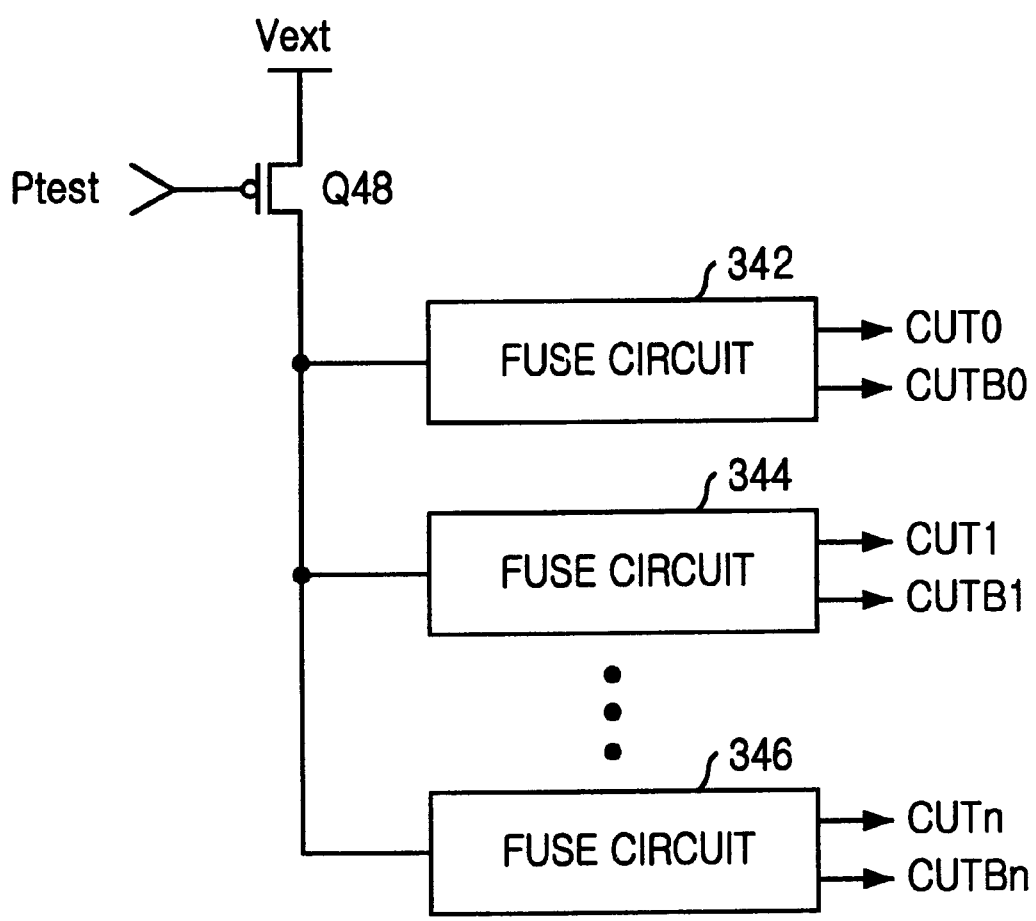
FIG. 15 illustrates the fuse circuit block shown in FIG. 14, according to one embodiment of the present invention.

FIG. 15 illustrates the fuse circuit block shown in FIG. 14, according to one embodiment of the present invention. In FIG. 15, the fuse circuit block 340 is composed of a PMOS transistor Q48 and a plurality of fuse circuits 342, 344 and 346. The PMOS transistor Q48 is turned on when the test mode signal Ptest is "high", to supply the fuse circuits 342, 344 and 346 with the external power voltage Vext.

Figure 16:
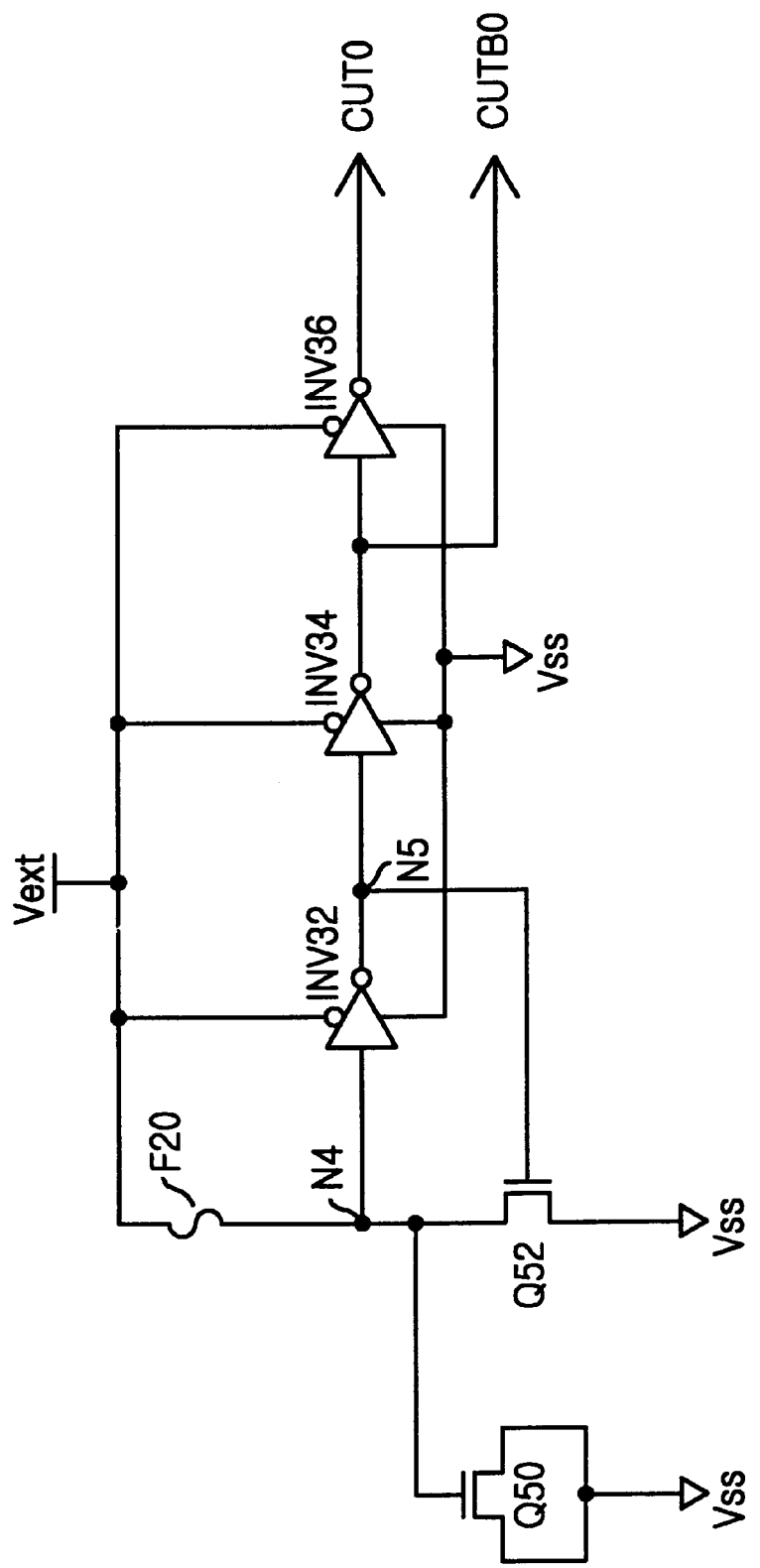
FIG. 16 illustrates one example of the fuse circuit shown in FIG. 15.

FIG. 16 illustrates one example of the fuse circuit 342 shown in FIG. 15; the other fuse circuits 344 and 346 can also be implemented like this. Referring to FIG. 16, the fuse circuit 342 includes NMOS transistor Q50 and Q52, a fuse F20, and inverters INV32, INV34 and INV36. The fuse F20 is programmed (or selectively cut) concurrently with the repair for the internal circuit, after the test for the function blocks of the internal circuit. The fuse F20 can be, for example, composed of polysilicon and be selectively cut by laser beam. The NMOS transistor Q50 has a source and a drain commonly coupled to the ground and a gate coupled to the node N4, so as to function as a capacitor. The inverters INV32, INV34 and INV36 are coupled in series between the node N4 and the positive output CUT0.

In this circuit configuration, if the fuse F20 is connected, the external power voltage Vext can be delivered to the node N4. Thus, the node N4 becomes "high" level, which is inverted by the inverter INV32 so that the node N5 becomes "low" level. The gate of NMOS transistor Q52 is coupled to the node N5, so that the NMOS transistor Q52 is continuously turned on, which makes the "high" level of the node N4 stable. The "low" level of node N5 is buffered by the inverters INV34 and INV36 so as to be produced as the positive output CUT0. Also, the "low" level of the node N5 is inverted by the inverter INV34 so as to be generated as the negative output CUTB0.

On the other hand, if the fuse F20 is cut, the node N4 is "low" and the NMOS transistor Q52 is turned on. So the positive output CUT is "high" level and the negative output CUTB is "low" level.

Figure 17:
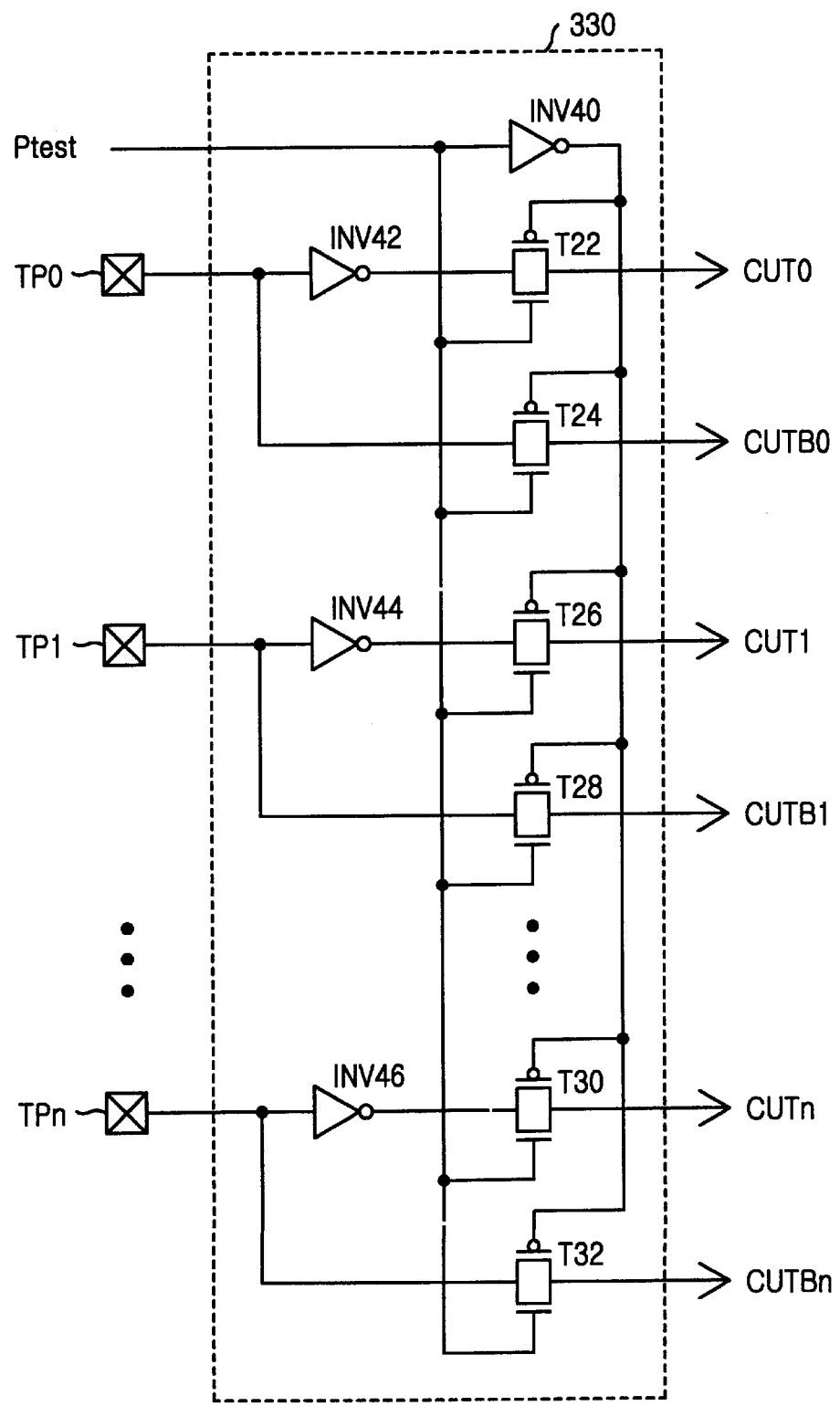
FIG. 17 illustrates one embodiment of the pseudo fuse circuit block shown in FIG. 14.

FIG. 17 illustrates one embodiment of the pseudo fuse circuit block 330 shown in FIG. 14. Referring to FIG. 17, the pseudo fuse circuit block 330 includes a plurality of transfer gates T22, T24 T26, T28, T30 and T32, and a plurality of inverters INV40, INV42, INV44 and INV46. Each of the transfer gates T22, T24 T26, T28, T30 and T32 is composed of a PMOS transistor and a NMOS transistor, the sources and the drains of which are commonly coupled to each other, respectively. The transfer gates T24, T28 and T32 are coupled between the plurality of test power voltage pads TP0, TP1, ..., TPn and the negative outs CUTB0, CUTB1, ..., CUTBn, respectively and the transfer gates T22, T26 and T30 are coupled between the corresponding output of the inverter and the positive outputs CUT0, CUT1, ..., CUTn. The gates of PMOS transistors constituting for transfer gates T22, T24, T26, T28, T30 and T32 are applied with the inverted test mode signal/Ptest, while the gates of NMOS transistors are applied with the test mode signal Ptest. Thus, when the test mode signal Ptest is "high" level(that is, when test mode), the transfer gates T22, T24, T26, T28, T30 and T32 are turned on. The inverters INV42, INV44 and INV46 invert the signals applied to the plurality of test power voltage pads TP0, TP1, ..., TPn so as to apply the inverted results to corresponding transfer gates T22, T26, T30, respectively.

Accordingly, when the test mode signal Ptest is activated to "high" level, the transfer gates T22, T24, T26, T28, T30 and T32 are turned on so that the signals applied to the test power voltage pads TP0, TP1, ..., TPn are revealed at the positive outputs CUT0, CUT1, ..., CUTn and the inverted signals thereof are revealed at the negative outs CUTB0, CUTB1, ..., CUTBn.

Figure 18:
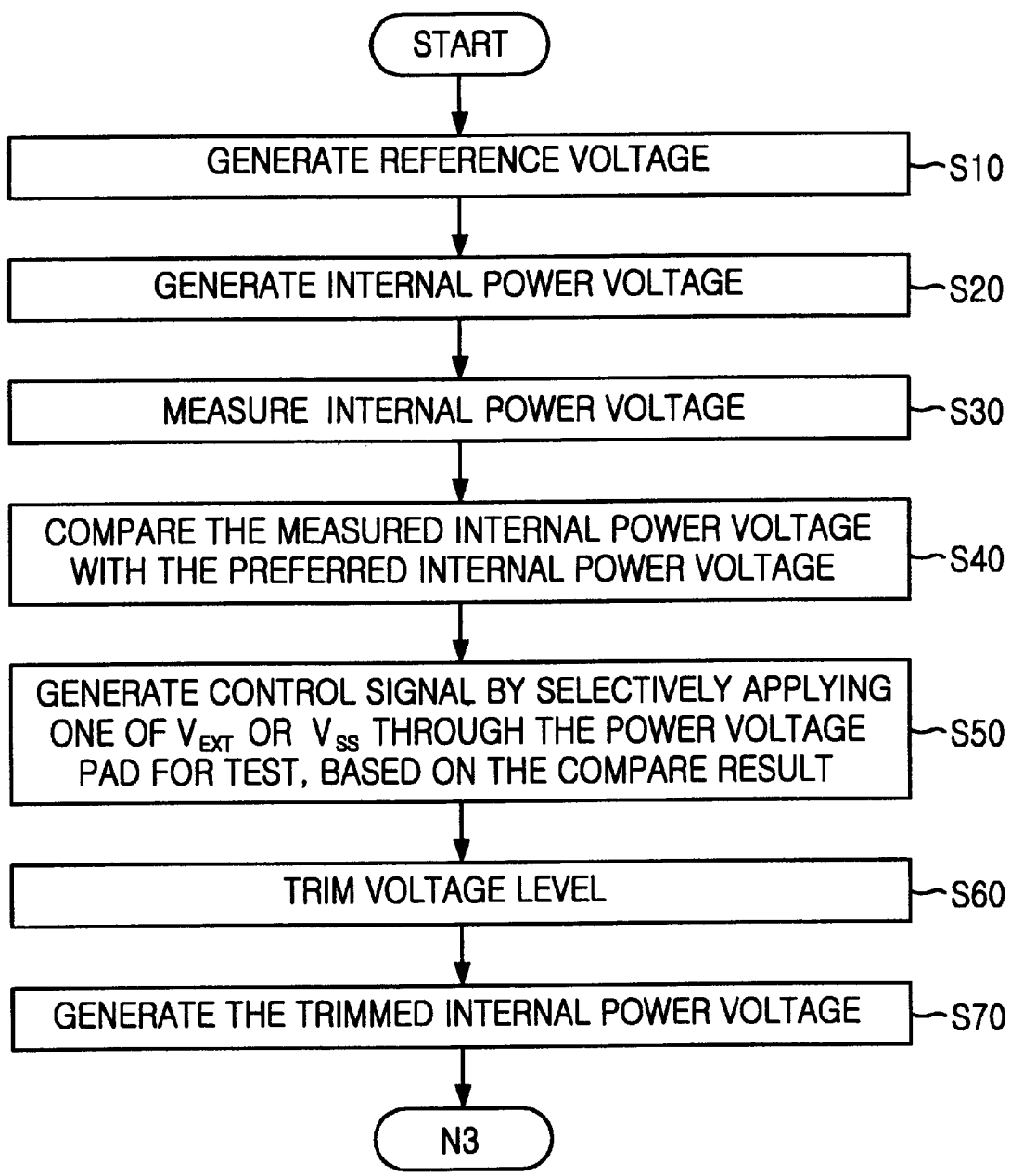
FIG. 18 is a flowchart for illustrating the method for generating internal voltage of semiconductor device, in accordance with one preferred embodiment of the present invention.

FIG. 18 is a flowchart for illustrating the method for generating internal voltage of semiconductor device, in accordance with one preferred embodiment of the present invention.

Referring to FIG. 18, in step S10, the external power voltage Vext is inputted and the reference voltage Vr1, the level of which is stable irrespective of the variation of the external power voltage Vext and temperature, is generated. Then, the internal power voltage Vint is generated based on the reference voltage Vr1 in step S20. the internal power voltage Vint generated in step S20, has never been trimmed. For generating this internal power voltage Vint, the methods shown in FIG. 20 can be performed prior to the step S20.

Figure 20:
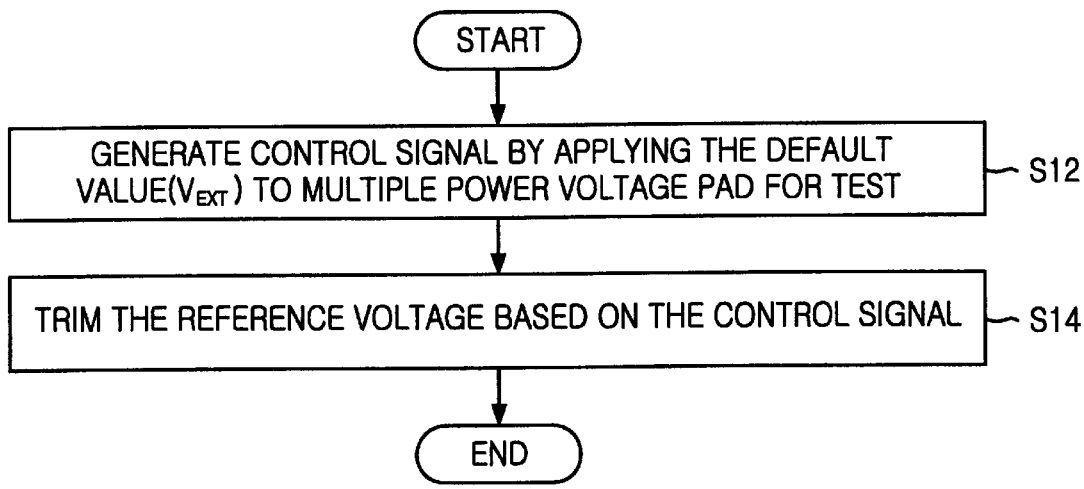

Referring to FIG. 20, the plurality of test power voltage pads TP0, TP1, ..., TPn are applied with the external power voltage Vext as default value so as to produce control signals in step S12. For example, the test power voltage pads TP0, TP1, ..., TPn shown in FIG. 4 are applied with the external power voltage Vext so that the control signal S0 among the control signals S0, S1, S2, S3, S4, S5, S6 and S7 is activated to "high" level and it is applied to the voltage level trimming unit as shown in FIG. 6. Then, in step S14, the reference voltage Vr1 is trimmed according to the control signal. In case that the level trimming is performed at the voltage level trimming unit as shown in FIG. 6, there is no substantial trimming since the control signal S0 is "high".

Referring back to FIG. 18, the internal power voltage Vint generated in step S20 is measured, in step S30. Subsequently, in step S40, the measured internal power voltage is compared with a desired internal power voltage.

In step S50, the trimming control signal is generated by selectively applying the external power voltage Vext or the ground voltage Vss through the test power voltage pads TP0, TP1, ..., TPn in response to the comparing result of step S40. Here, the steps S40 and S50 are performed in test stage, that is they can be accomplished in a test equipment. Then, the reference voltage Vr1 is trimmed based on the trimming control signal generated in step S50, so as to produce the trimmed reference voltage Vr2 in step S60. Also, in step S70, the trimmed internal power voltage is generated based on the trimmed reference voltage Vr2 and the process is transferred to N3. In FIG. 18, after performing the step S10 and before the S20, the step for amplifying the reference voltage Vr1 can be further included. In this case, the trimmed reference voltage Vr2 is generated by trimming the amplified reference voltage according to the trimming control signal.

Figure 19:
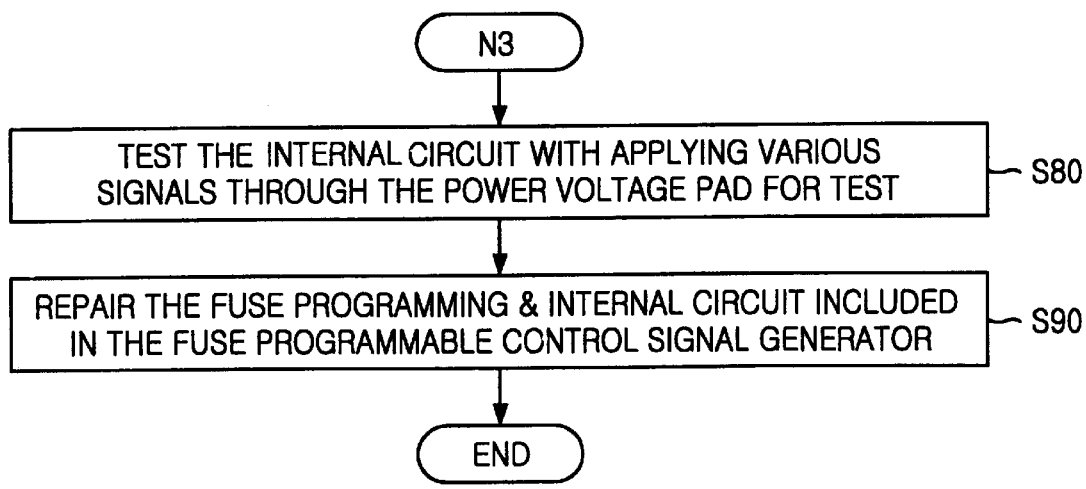
FIGS. 19 and 20 show parts of the method for generating internal voltage of semiconductor device, according to other embodiments of the present invention, respectively.

Then, referring to FIG. 19, N3 initiates the process. In step S80, the internal circuit is tested while it is driven by the trimmed internal power voltage generated in step S70 of FIG. 18. Then, in step S90, the fuse for generating control signal is programmed such that the control signal is the same as the trimming control signal after finishing the test and the repair for function blocks of the internal circuit is performed. Here, the repair for the internal circuit can be performed by programming fuses included in the internal circuit.

Figure 21:
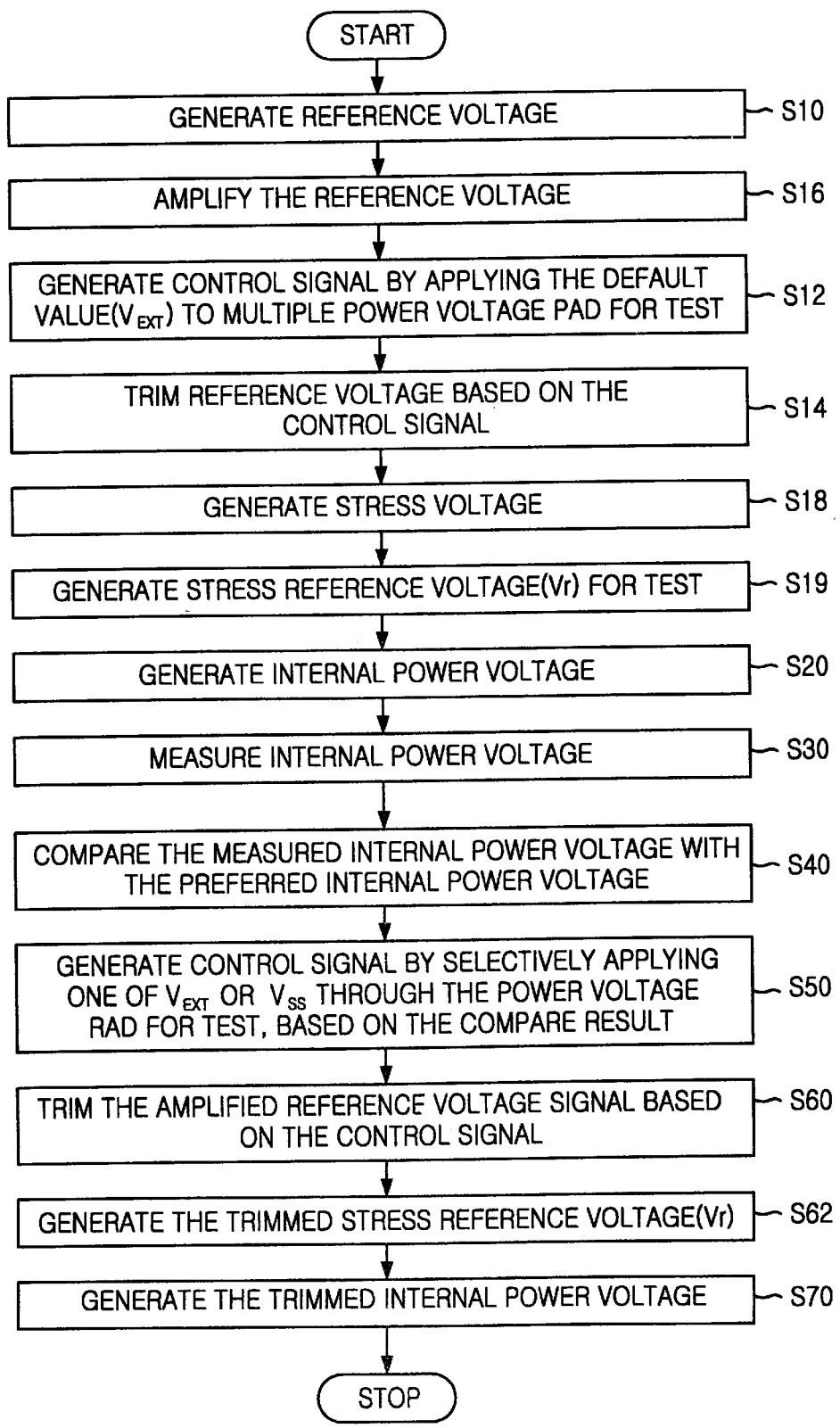
FIG. 21 is a flowchart for illustrating the method for generating internal voltage of semiconductor device, in accordance with another embodiment of the present invention.

FIG. 21 is a flowchart for illustrating the method for generating internal voltage of semiconductor device, in accordance with another embodiment of the present invention. In FIG. 21, the steps same as that of FIGS. 18–20 are identified by the same reference numerals and the explanation will be omitted, as occasion demands.

Referring to FIG. 21, in step S10, the external power voltage Vext is inputted and used for generating the reference voltage Vr1, the level of which is uniform irrespective of the variation of temperature and/or external power voltage Vext. Then the reference voltage Vr1 generated in step S10 is amplified so as to produce the amplified reference voltage Vr3, in step S16. In step S12, the measuring control signal is generated by applying the external power voltage Vext as default value to the plurality of test power voltage pads TP0, TP1, ..., TPn. The measuring control signal is such a control signal that any substantial trimming would not be made. Then, by trimming the reference voltage Vr1 according to the control signal, the amplified reference voltage Vr3 is substantially intact: to be produced as the trimmed reference voltage Vr2 in step S14. The stress voltage $V_{stress}$, which is proportional to the external power voltage Vext, is generated in step S18. The trimmed reference voltage Vr2 (which is substantially the same as the un-trimmed amplified reference voltage) and the stress voltage $V_{stress}$ are combined so as to produce the stress reference voltage Vr for test in step S19. the internal power voltage Vint is generated in step S20 based on the stress reference voltage Vr generated in step S19 and it is measured in step S30. The measured internal power voltage Vint of step S30 is compared with a desired internal power voltage in step S40, and the control signal S for voltage level trimming is generated by selectively applying the external power voltage Vext or the ground voltage Vss in accordance with the comparing result of step S50. In step S60, the amplified reference voltage Vr3 is trimmed based on the control signal generated in step S50, so as to produce the trimmed reference voltage Vr2. In step S62, the stress voltage $V_{stress}$ of the step S18 and the trimmed reference voltage Vr2 of the step S60 are processed to produce the stress reference voltage Vr and the trimmed internal power voltage Vint is generated based on the stress reference voltage Vr in step S70. After the step S70, it is preferable that the steps as shown in FIG. 19 may be performed.

As described above, the present invention makes it possible for the test for function of internal circuit to be performed without any fuse programming in manufacturing process of semiconductor device, in which the fuses are included in an internal voltage generating circuit. Thus, the inconvenience of having to repeatedly carry the semiconductor device between a test equipment and a test equipment is avoided. Also, the fuse programming of internal voltage generating circuit can be accomplished simultaneously with the repair for internal circuit (e.g. the row repair and column repair of semiconductor memory device).

Thus, the present invention is capable of reducing the manufacturing time required for semiconductor device, thereby improving the productivity to that extent.

Although preferred embodiments of the present invention have been illustrated and described, various alternatives, modifications and equivalents may be used. Therefore, the foregoing description should not be taken as limiting the scope of the present invention which is defined by the appended claims.

What is claimed is:

1. An internal voltage generating circuit in semiconductor device for converting an external power voltage applied from the semiconductor device into an internal voltage for driving an internal circuit, comprising:
   a plurality of test power voltage pads, each of which can be selectively applied with the external power voltage and a ground voltage during test;
   a fuse programmable control signal generator coupled to the plurality of test power voltage pads, for generating a control signal according to the signals applied to the plurality of said test power voltage pads during test, and for generating the control signal according to fuse-programmed state after at least one fuse included therein is programmed;
   a reference voltage generator for receiving the external power voltage so as to produce a reference voltage having a predetermined level;
   a voltage trimming unit for trimming the reference voltage in accordance with the output of the fuse programmable control signal generator; and
   a reference voltage amplifier coupled between said reference voltage generator and the voltage level trimming unit, for amplifying the reference voltage and producing the amplified voltage to said voltage level trimming unit.

2. The internal voltage generating circuit in semiconductor device in accordance with the claim 1, further comprising:
   an internal voltage driver for receiving the output of the voltage level trimming unit so as to produce the internal power voltage for driving the internal circuit.

3. An internal voltage generating circuit in semiconductor device for converting an external power voltage applied from the semiconductor device into an internal voltage for driving an internal circuit, comprising:
   a plurality of test power voltage pads, each of which can be selectively applied with the external power voltage and a ground voltage during test;
   a fuse programmable control signal generator coupled to the plurality of test power voltage pads, for generating a control signal according to the signals applied to the plurality of said test power voltage pads during test, and for generating the control signal according to fuse-programmed state after at least one fuse included therein is programmed;
   a reference voltage generator for receiving the external power voltage so as to produce a reference voltage having a predetermined level;
   a voltage trimming unit for trimming the reference voltage in accordance with the output of the fuse programmable control signal generator;
   a stress voltage generator for receiving the external power voltage and generating a stress voltage proportional to the external power voltage; and
   a reference voltage modifying unit for inputting the trimmed reference voltage which is output of said voltage level trimming unit and the stress voltage, and for producing the trimmed reference voltage when the external power voltage is equal to or lower than a predetermined level and for producing the stress voltage when the external power voltage is higher than the predetermined level.

4. The internal voltage generating circuit in semiconductor device in accordance with the claim 3, further comprising:
   an internal voltage driver for receiving the output of the voltage level trimming unit so as to produce the internal power voltage in order to drive the internal circuit.

5. The internal voltage generating circuit in semiconductor device in accordance with the claim 4, wherein said internal voltage driver comprises:
   an operation mode signal generator for generating an operation mode signal representing whether an operation mode of the semiconductor device is active mode or stand-by mode;
   an active internal voltage driver activated when the operation mode signal represents active mode, so as to generate the internal power voltage for driving the internal circuit, based on the stress reference voltage, said stress reference voltage being the output of the reference voltage modifying unit; and
   a stand-by internal voltage driver activated irrespective of the operation mode signal, so as to generate the internal power voltage for driving the internal circuit, based on the stress reference voltage.

6. An internal voltage generating circuit in semiconductor device for converting an external power voltage applied from the semiconductor device into an internal voltage for driving an internal circuit, comprising:
   a plurality of test power voltage pads, each of which can be selectively applied with the external power voltage and a ground voltage during test;
   a fuse programmable control signal generator coupled to the plurality of test power voltage pads, for generating a control signal according to the signals applied to the plurality of said test sower voltage Dads during test, and for generating the control signal according to fuse-programmed state after at least one fuse included therein is programmed;
   a reference voltage generator for receiving the external power voltage so as to produce a reference voltage having a predetermined level; and
   a voltage trimming unit for trimming the reference voltage in accordance with the output of the fuse programmable control signal generator;
   wherein said fuse programmable control signal generator comprises:

a fuse circuit block including a plurality of fuse circuits, each of the fuse circuits including a programmable fuse and being coupled to the corresponding test power voltage pad, respectively;

a decoding unit for decoding the output of the fuse circuit block so as to produce the control signal.

7. An internal voltage generating circuit in semiconductor device for converting an external power voltage applied from the semiconductor device into an internal voltage for driving an internal circuit, comprising:

a plurality of test power voltage pads, each of which can be selectively applied with the external power voltage and a ground voltage during test;

a fuse programmable control signal generator coupled to the plurality of test power voltage pads, for generating a control signal according to the signals applied to the plurality of said test power voltage pads during test, and for generating the control signal according to fuse-programmed state after at least one fuse included therein is programmed;

a reference voltage generator for receiving the external power voltage so as to produce a reference voltage having a predetermined level; and a voltage trimming unit for trimming the reference voltage in accordance with the output of the fuse programmable control signal generator, wherein said voltage level trimming unit comprises:
an input node for inputting a voltage to be trimmed;
an output node for outputting the trimmed reference voltage the level of which is trimmed;
a plurality of resistors coupled in series between said input node and said output node; and
a plurality of transfergates, one of which is coupled between said input node and said output node, the others of which are coupled in parallel between the connection point of said resistors and said output node, respectively, each of the transfer gates being turned on/off in response to corresponding control signal.

8. An internal voltage generating circuit in semiconductor device for converting an external power voltage applied from the semiconductor device into an internal voltage for driving an internal circuit, comprising:

a plurality of test power voltage pads, each of which can be selectively applied with the external power voltage and a ground voltage during test;

a fuse programmable control signal generator coupled to the plurality of test power voltage pads, for generating a control signal according to the signals applied to the plurality of said test power voltage pads during test, and for generating the control signal according to fuse-programmed state after at least one fuse included therein is programmed;

a reference voltage generator for receiving the external power voltage so as to produce a reference voltage having a predetermined level; and a voltage trimming unit for trimming the reference voltage in accordance with the output of the fuse programmable control signal generator;

wherein said fuse programmable control signal generator comprises:
a test mode signal generator for generating a test mode signal representing whether the operation mode of the semiconductor device is test mode;
a pseudo fuse circuit block activated when the test mode signal represents that the operation mode is test mode, said pseudo fuse circuit block producing a positive output signal (CUT) and a negative output signal (CUTB) based on the signals applied to said plurality of test power voltage pads;
a fuse circuit block activated when the test mode signal represents that the operation mode is not test mode and including a plurality of fuses, said fuse circuit block producing the positive output signal and the negative output signal based on the programmed state of the plurality of fuses included therein; and
a decoding unit coupled to both said pseudo fuse circuit block and said fuse circuit block so as to decode the positive output and the negative output.

9. The internal voltage generating circuit in semiconductor device in accordance with the claim 8, wherein said pseudo fuse circuit unit comprises:

a plurality of first inverters, each having an input coupled to corresponding one of said plurality of test power voltage pad;

a plurality of first transfergates, each of which is coupled between the output of corresponding first inverter and the positive output and turned on when the test mode signal represents the test mode; and a plurality of second transfergates, each of which is coupled between the corresponding test power voltage pad and said negative output and turned on when the test mode signal represents the test mode.

10. The internal voltage generating circuit in semiconductor device in accordance with the claim 8, wherein said fuse circuit block comprises:

a PMOS transistor having a source coupled to the external power voltage and a gate applied with the test mode signal; and a plurality of fuse circuits, each of which includes at least one fuse and is coupled to the drain of said PMOS transistor, so as to input the external power voltage when the test mode signal is "low" and to produce the positive output signal and the negative output signal based on the programmed state of the fuses included therein.

11. A method for generating an internal voltage of semiconductor device by converting an external power voltage applied to the semiconductor device, said internal voltage being used for driving an internal circuit included in the semiconductor device, said method comprising the steps of:

generating a reference voltage having a predetermined level based on the external power voltage;

generating an internal power voltage based on the reference voltage;

measuring the internal power voltage;

comparing the measured internal power voltage with a preferred internal power voltage;

generating a trimming control signal by selectively applying the external power voltage or a ground voltage through a plurality of test power voltage pads, based on the result of the step for comparing;

generating a trimmed reference voltage by trimming the level of the reference voltage in response to the trimming control signal; and generating a trimmed internal power voltage based on the trimmed reference voltage.

12. The method for generating an internal voltage of semiconductor device in accordance with the claim 11, further comprising the steps of:

testing the internal circuit while the internal circuit is driven by the trimmed internal power voltage; and programming at least one fuse for generating a control signal such that the control signal is the same as the trimming control signal, after the step of testing.

13. The method for generating an internal voltage of semiconductor device in accordance with the claim 12, wherein the internal circuit is repaired simultaneously the step of programming.

14. The method for generating an internal voltage of semiconductor device in accordance with the claim 11, further comprising the step of amplifying the reference voltage before the step of generating the trimmed reference voltage and after the step of generating the reference voltage, and wherein said trimmed reference voltage is generated by trimming the amplified reference voltage in accordance with the trimming control signal.

15. The method for generating an internal voltage of semiconductor device in accordance with the claim 14, wherein said step of generating the internal power voltage which is performed before the step of measuring, comprises the steps of:

generating a measurement control signal by applying the plurality of test power voltage pads with the external power voltage as default signal; and trimming the amplified reference voltage in accordance with the measurement control signal.

16. The method for generating an internal voltage of semiconductor device in accordance with the claim 11, further comprising the steps of:

generating a stress voltage proportional to the external power voltage; and generating a stress reference voltage by combining the trimmed reference voltage with the stress reference voltage, and wherein the internal power voltage for driving the internal circuit is generated based on the stress reference voltage.

* * * * *